United States Patent
Lee et al.

(10) Patent No.: US 7,482,236 B2
(45) Date of Patent: Jan. 27, 2009

(54) STRUCTURE AND METHOD FOR A SIDEWALL SONOS MEMORY DEVICE

(75) Inventors: Tzyh-Cheang Lee, Hsinchu (TW); Fu-Liang Yang, Hsin-Chu (TW); Jiunn-Ren Hwang, Hsin-Chu (TW); Tsung-Lin Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 95 days.

(21) Appl. No.: 11/602,809

(22) Filed: Nov. 21, 2006

(65) Prior Publication Data
US 2007/0212841 A1 Sep. 13, 2007

Related U.S. Application Data

(63) Continuation-in-part of application No. 11/327,185, filed on Jan. 6, 2006, now Pat. No. 7,405,119.

(60) Provisional application No. 60/756,875, filed on Jan. 6, 2006.

(51) Int. Cl.
*H01L 21/8234* (2006.01)
(52) U.S. Cl. ............... 438/303; 438/595; 438/954; 257/E21.626
(58) Field of Classification Search .......... 438/954
See application file for complete search history.

(56) References Cited

U.S. PATENT DOCUMENTS

| 6,756,271 | B1 * | 6/2004 | Satoh et al. ............ 438/258 |
| 6,858,497 | B2 * | 2/2005 | Moriya et al. .......... 438/262 |
| 6,862,251 | B2 | 3/2005 | Yaoi et al. |
| 7,102,192 | B2 * | 9/2006 | Ono ..................... 257/316 |
| 7,154,142 | B2 * | 12/2006 | Wong et al. ............ 257/316 |
| 2003/0011017 | A1 | 1/2003 | Lee et al. |
| 2004/0005761 | A1 * | 1/2004 | Shibata ................. 438/261 |
| 2007/0063267 | A1 * | 3/2007 | Jeon et al. ............. 257/324 |

* cited by examiner

*Primary Examiner*—Stephen W Smoot
(74) *Attorney, Agent, or Firm*—Slater & Matsil, L.L.P.

(57) ABSTRACT

A gate stack is formed on a substrate. The gate stack has a sidewall. An oxide-nitride-oxide material is deposited on the gate stack. Portions of the oxide-nitride-oxide material are removed to form an oxide-nitride-oxide structure. The oxide-nitride-oxide structure has a generally L-shaped cross-section with a vertical portion along at least part of the gate stack sidewall and a horizontal portion along the substrate. A top oxide material is deposited over the substrate. A silicon nitride spacer material is deposited over the top oxide material. Portions of the top oxide material and the silicon nitride spacer material are removed to form a silicon nitride spacer separated from the oxide-nitride-oxide stack by the top oxide material. Source/drain regions are formed in the substrate.

20 Claims, 24 Drawing Sheets

STRUCTURE AND METHOD FOR A SIDEWALL SONOS MEMORY DEVICE

This application claims the benefit of U.S. Provisional Application Ser. No. 60/756,875, filed on Jan. 6, 2006, entitled Sidewall SONOS with Protected Storage Film, which application is incorporated herein by reference.

This application is a continuation-in-part of U.S. patent application Ser. No. 11/327,185, filed on Jan. 6, 2006, now U.S. Pat. No. 7,405,119 entitled Structure and Method for a Sidewall SONOS Memory Device, which application is incorporated herein by reference.

TECHNICAL FIELD

The present invention generally relates to memory devices. In one aspect it relates more particularly to a system and method for a sidewall SONOS memory device.

BACKGROUND

Non-volatile memory has been integrated into a wide range of electronic technologies including cellular communication, digital video, digital audio, and compact data storage (i.e., flash memory cards, flash memory sticks, and USB flash drives). Silicon-oxide-nitride-oxide-silicon (SONOS) memory is a non-volatile semiconductor memory, at the heart of which is a transistor that can retain a value without a constant power supply. During operation, a conventional SONOS memory transistor stores a single charge in a nitride layer sandwiched between two thin oxide layers. The oxide layers are in turn sandwiched between two silicon layers. These two silicon layers are typically a polysilicon gate electrode (i.e., the controlling gate) and the silicon substrate.

Sidewall SONOS technology improves upon SONOS technology by storing two bits per transistor. A sidewall SONOS transistor stores two discrete bits, in contrast with the one bit stored by a conventional SONOS transistor. FIG. 1 shows the cross-section of a known sidewall SONOS transistor 10. The transistor 10 includes an oxide 16 formed around a gate electrode 12 and a gate dielectric 14. The gate dielectric 14 is directly over a silicon substrate 17. A material 18 with charge trapping properties overlies the substrate 17, and includes portions 22 that are directly adjacent the oxide 16. A silicon oxide spacer 20 is adjacent the gate electrode 12.

The sidewall SONOS transistor 10 is repeated thousands, millions, and billions of times in a memory array (not shown). Because the sidewall SONOS transistor 10 is repeated numerous times, the design of the sidewall SONOS transistor 10 is critical to the reliability and compactness of the SONOS memory as a whole.

The sidewall SONOS transistor 10 in FIG. 1 has several disadvantages. First, the sidewall SONOS transistor 10 may suffer from electron drift. During operation, an electric charge is stored in the region 22. However, the region 22 is electrically connected to larger adjacent regions of the charge storing material 18, and electrons (not shown) in the region 22 may drift, thus degrading the charge density in the region 22. Charge density in the region 22 is critical to the performance of the sidewall SONOS transistor 10. The degradation of electric charge density in the region 22 may erroneously alter the value read from the transistor 10. The flaw is compounded by the number of times the sidewall SONOS transistor 10 is repeated in the SONOS memory.

In addition to suffering from electron drift, the sidewall SONOS transistor 10 shown in FIG. 1 is poorly suited for downward scalability. For example, the transistor 10 may not be scalable to a semiconductor process technology generation below 0.130 microns (μm). The transistor 10 has a silicon oxide (SiO2) spacer 20, but technological barriers exist, which prevent the manufacturing of silicon oxide gate spacers in sub-0.130 μm semiconductor manufacturing technologies. In addition, the substantially L-shaped formation of the region 22 of the charge trapping material 18 is not reproducible in a sub-0.130 μm manufacturing technology.

FIG. 2 shows a cross-section of a conventional sidewall SONOS transistor 30 manufactured in a sub-0.130 μm technology generation. The transistor 30 includes a gate spacer 32, separated from the gate electrode 12 and gate dielectric 14, by an oxide 16. The spacer 32 has charge storing properties, and during operation, an electric charge may be formed in the spacer 32. However, the spacer 32 is sufficiently voluminous to suffer from electron drift. The dissipation of electrons in the spacer 32 reduces the charge density in the spacer 32, resulting in possible data retention and reliability issues. Hence, there is a need for a reliable sidewall SONOS transistor that is scalable to sub-0.130 μm semiconductor manufacturing technology generations.

SUMMARY OF THE INVENTION

The problems and needs outlined above may be addressed by embodiments of the present invention. In accordance with one aspect of the present invention, a method for manufacturing a semiconductor device is described. This method includes the following steps described in this paragraph, and the order of steps may vary, if not otherwise stated. A gate stack is formed on a substrate. The gate stack has a sidewall. An oxide-nitride-oxide material is deposited on the gate stack. Portions of the oxide-nitride-oxide material are removed to form an oxide-nitride-oxide structure. The oxide-nitride-oxide structure has a generally L-shaped cross-section with a vertical portion along at least part of the gate stack sidewall and a horizontal portion along the substrate. A top oxide material is deposited over the substrate. A silicon nitride spacer material is deposited over the top oxide material. Portions of the top oxide and the silicon nitride are removed to form a silicon nitride spacer separated from the oxide-nitride-oxide stack by the top oxide material. Source/drain regions are formed in the substrate.

In accordance with another aspect of the present invention, a method for manufacturing a semiconductor device is described. This method includes the following steps described in this paragraph, and the order of steps may vary, if not otherwise stated. A gate stack is formed on a substrate. The gate stack has a sidewall. A recess is formed in a lower portion of the sidewall. An oxide-nitride-oxide material is deposited on the gate stack. Portions of the oxide-nitride-oxide material are removed to form an oxide-nitride-oxide structure. The oxide-nitride-oxide structure has a generally L-shaped cross-section. The oxide-nitride-oxide structure is conformably formed in the recessed portion of the sidewall. A vertical portion of the oxide-nitride-oxide structure is formed along at least part of the gate stack sidewall and a horizontal portion of the oxide-nitride-oxide structure is formed along the substrate. A top oxide material is deposited over the substrate. A silicon nitride spacer material is deposited over the top oxide material. Portions of the top oxide and the silicon nitride are removed to form a silicon nitride spacer separated from the oxide-nitride-oxide stack by the top oxide material. Source/drain regions are formed in the substrate.

In accordance with yet another aspect of the present invention, a method for manufacturing a semiconductor device is described. This method includes the following steps described in this paragraph, and the order of steps may vary, if not otherwise stated. A gate stack is formed on a substrate. The gate stack has a sidewall. A substrate recess is formed adjacent to the gate stack. An oxide-nitride-oxide material is deposited over the substrate. Portions of the oxide-nitride-oxide material are removed to form an oxide-nitride-oxide structure. The oxide-nitride-oxide structure has a generally L-shaped cross-section with a vertical portion along at least part of the gate stack sidewall and a horizontal portion along the substrate. A top oxide material is deposited over the substrate. A silicon nitride spacer material is deposited over the top oxide material. Portions of the top oxide and the silicon nitride are removed to form a silicon nitride spacer separated from the oxide-nitride-oxide stack by the top oxide material. Source/drain regions are formed in the substrate.

In accordance with still another aspect of the present invention, a method for manufacturing a semiconductor device is described. This method includes the following steps described in this paragraph, and the order of steps may vary, if not otherwise stated. A gate stack is formed on a substrate. The gate stack has a sidewall. A tunneling oxide material is deposited on the gate stack. A nitride material is deposited on the tunneling oxide. Portions of the tunneling oxide and of the nitride material are removed. The tunneling oxide is extended adjacent to the gate stack and is extended adjacent to the substrate. The nitride material is formed in an inner corner of the tunneling oxide material, and the nitride material has a generally quarter-round shaped cross-section. A top oxide material is deposited over the substrate. A silicon nitride spacer material is deposited over the top oxide material. Portions of the top oxide and the silicon nitride are removed to form a silicon nitride spacer separated from the tunneling oxide and the nitride material by the top oxide material. Source/drain regions are formed in the substrate.

In accordance with yet another aspect of the present invention, a method for manufacturing a semiconductor device is described. This method includes the following steps described in this paragraph, and the order of steps may vary, if not otherwise stated. A gate stack is formed on a substrate. The gate stack has a sidewall. A substrate recess is formed adjacent to the gate stack. A recess is formed in a lower portion of the sidewall. A tunneling oxide material is deposited on the gate stack. A nitride material is deposited on the tunneling oxide. Portions of the tunneling oxide and of the nitride material are removed. The tunneling oxide is extended adjacent to the gate stack and is extended adjacent to the substrate. The tunneling oxide and the nitride material are conformably formed in the recessed portion of the sidewall and in the substrate recess. The nitride material is formed in an inner corner of the tunneling oxide material, and the nitride material has a generally quarter-round shaped cross-section. A top oxide material is deposited over the substrate. A silicon nitride spacer material is deposited over the top oxide material. Portions of the top oxide and the silicon nitride are removed to form a silicon nitride spacer separated from the tunneling oxide and the nitride material by the top oxide material. Source/drain regions are formed in the substrate.

In accordance with still another aspect of the present invention, a method for manufacturing a semiconductor device is described. This method includes the following steps described in this paragraph, and the order of steps may vary, if not otherwise stated. A gate stack is formed on a substrate, the gate stack has a sidewall. A substrate recess is formed adjacent to the gate stack. A recess is formed in a lower portion of the sidewall, and a tunneling oxide is deposited on the gate stack. A nitride material is deposited on the tunneling oxide. Portions of the tunneling oxide and of the nitride material are removed. The tunneling oxide is extended adjacent to the gate stack and is extended adjacent to the substrate. The tunneling oxide and the nitride material are conformably formed in the recessed portion of the sidewall and in the substrate recess. The nitride material is formed in an inner corner of the tunneling oxide. The nitride material has a generally quarter-round shaped cross-section. The nitride material extends adjacent to the gate stack. A top oxide material is deposited over the substrate. A silicon nitride spacer material is deposited over the top oxide material. Portions of the top oxide and the silicon nitride are removed to form a silicon nitride spacer separated from the tunneling oxide and the nitride material by the top oxide material. Source/drain regions are formed in the substrate.

In accordance with yet another aspect of the present invention, a semiconductor device is described. The semiconductor device includes a substrate. The substrate includes source/drain regions. A gate stack is formed over the substrate and between the source/drain regions. An oxide-nitride-oxide structure is adjacent to the gate stack and has a generally L-shaped cross-section. The oxide-nitride-oxide structure extends adjacent to the gate stack and extends adjacent to the substrate. A top oxide material is conformably formed on the oxide-nitride-oxide structure. A nitride spacer is conformably formed on the top oxide material. A top of the oxide-nitride-oxide structure is recessed relative to a top of the gate stack.

In accordance with still another aspect of the present invention, a semiconductor device is described. The semiconductor device includes a substrate. The substrate includes source/drain regions. A gate stack is formed immediately over the substrate and between the source/drain regions. The gate stack has a recessed portion in a lower portion of the gate stack. An oxide-nitride-oxide structure is formed adjacent to the gate stack and has a generally L-shaped cross-section. The oxide-nitride-oxide structure is conformably formed in the recessed sidewall portion. The oxide-nitride-oxide structure extends adjacent to the gate stack and extends adjacent to the substrate. A top oxide material is conformably formed on the oxide-nitride-oxide structure. A nitride spacer is conformably formed on the top oxide.

In accordance with yet another aspect of the present invention, a semiconductor device is described. The semiconductor device includes a substrate. The substrate includes source/drain regions. A gate stack is formed over the substrate and adjacent to a recessed portion of the substrate. An oxide-nitride-oxide structure is formed adjacent to the gate stack. The oxide-nitride-oxide structure has a generally L-shaped cross-section. The oxide-nitride-oxide structure extends adjacent to the gate stack and extends adjacent to the substrate. At least part of the oxide-nitride-oxide structure is formed in the recessed portion of the substrate. A top oxide material is conformably formed on the oxide-nitride-oxide structure. A nitride spacer is conformably formed on the top oxide.

In accordance with still another aspect of the present invention, a semiconductor device is described. The semiconductor device includes a substrate. The substrate includes source/drain regions. A gate stack is formed over the substrate and adjacent to a recessed portion of the substrate. The tunneling oxide material extends adjacent the gate stack and extends adjacent the substrate. A tunneling oxide material has a generally L-shaped cross-section. A nitride material is formed in an inner corner of the tunneling oxide material. The nitride material has a generally quarter-round shaped cross-section. A top oxide material is formed over the nitride material. The top oxide material extends adjacent to the gate stack and extends adjacent to the substrate. A spacer material is conformably formed on the top oxide material.

In accordance with yet another aspect of the present invention, a semiconductor device is described. The semiconductor device includes a substrate. The substrate includes source/drain regions. The substrate has a recessed substrate portion. A gate stack is over the substrate and between the source/drain regions. The gate stack has a recessed sidewall portion formed over a recessed substrate portion. A nitride material is formed in an inner corner of a tunneling oxide. The nitride material has a generally quarter-round shaped cross-section. At least part the nitride material is in the recessed sidewall portion, and at least part of the nitride material is in the recessed substrate portion. A top oxide material is formed over the nitride material, the top oxide material extends adjacent to the gate stack and extends adjacent to the substrate. A spacer material is formed in an inner corner of the top oxide material.

In accordance with still another aspect of the present invention, a semiconductor device is described. The semiconductor device includes a substrate. The substrate includes source/drain regions. A gate stack is formed over the substrate and between the source/drain regions. The gate stack has a recessed portion formed over a recessed portion in the substrate. The nitride material is formed in an inner corner of a tunneling oxide. At least a portion of the nitride material is formed in the recessed portion of the gate stack and at least a portion of the nitride material is formed in the recessed portion of the substrate. The nitride material has a generally quarter-round shaped cross-section. The nitride material extends adjacent to the gate stack. A top oxide material is formed over the nitride material. The top oxide material extends adjacent to the gate stack and extends adjacent to the substrate. A spacer material is formed in an inner corner of the top oxide material.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
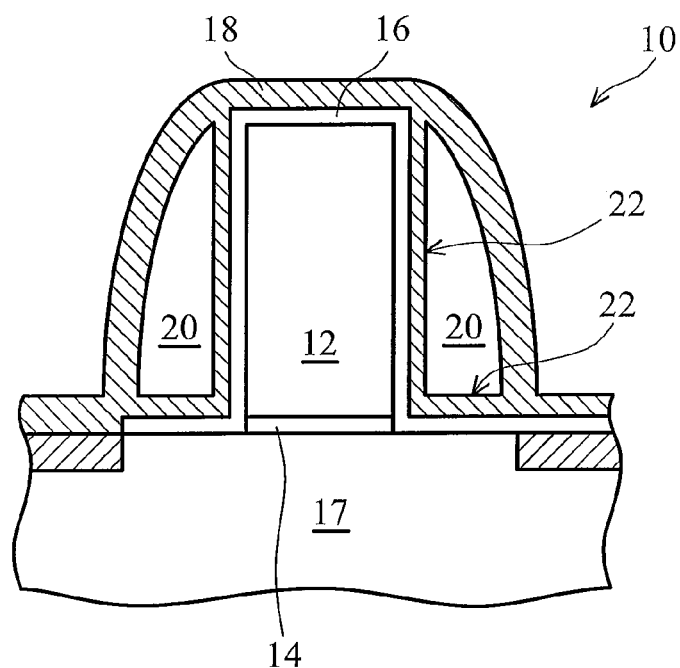
FIGS. 1 and 2 show cross-sectional views of sidewall SONOS transistors known in the art.
Figure 2:
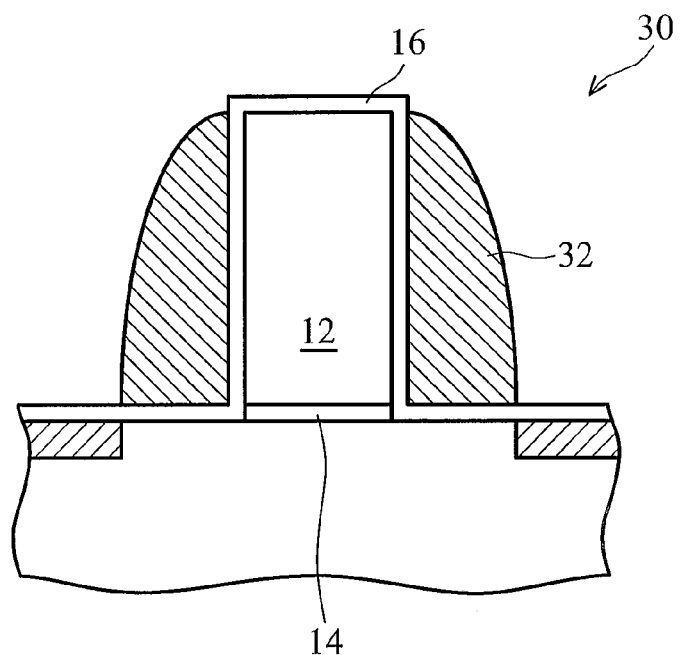

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Generally, an embodiment of the present invention provides a method of manufacturing a sidewall SONOS memory device. FIGS. 3A-3F illustrate a method of manufacturing a sidewall SONOS memory device in accordance with a first illustrative embodiment of the present invention. The cross-sectional views in FIGS. 3A-3F show the sidewall SONOS transistor 100 at various stages of a 60 nanometer (nm) semiconductor manufacturing process. Although the sidewall SONOS transistor 100 of this preferred illustrative embodiment is formed in a 60 nm technology generation, other embodiments of the present invention may be formed using semiconductor manufacturing processes at any technology generation, including 0.180 µm, 0.150 µm, 0.130 µm, and 0.90 µm (a.k.a. 90 nm), for example.

Figure 3A:
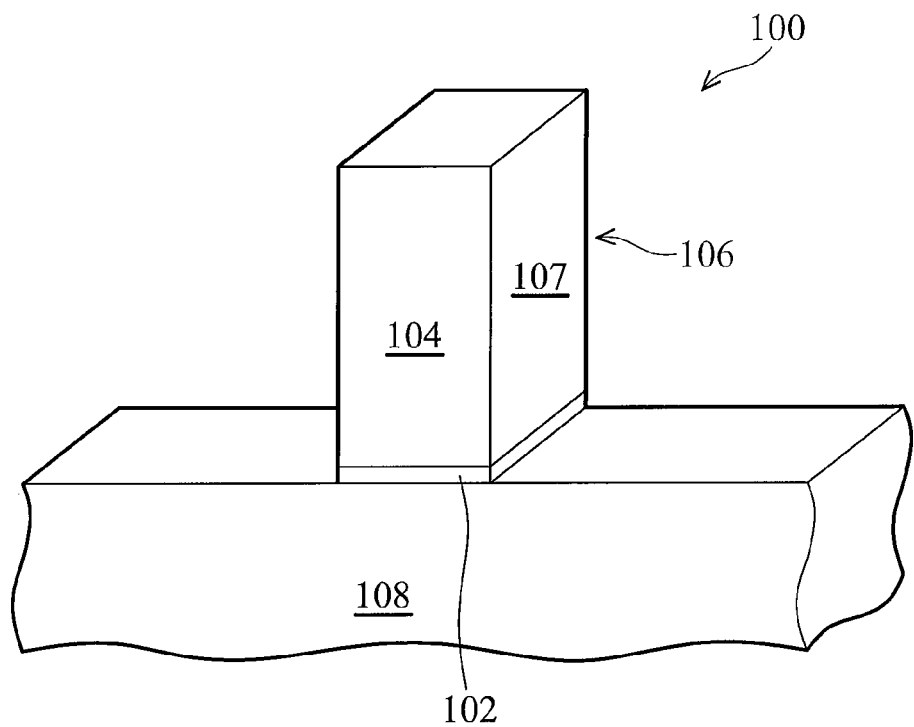
FIGS. 3A-3H show cross-sectional views of the non-volatile semiconductor memory device at various stages of a 60 nm semiconductor manufacturing process, in accordance with a preferred illustrative embodiment.

FIG. 3A shows a cross-sectional view in three dimensions of the sidewall SONOS transistor 100 at an intermediate stage of production, in accordance with a preferred illustrative embodiment. The sidewall SONOS transistor 100 includes a gate oxide 102 and a gate electrode 104. The gate oxide 102 and the gate electrode 104 are referred to collectively as a gate stack 106 herein. The gate stack 106 is directly over a p-type silicon substrate 108. A side 107 of the gate stack 106 is referred to as a sidewall 107.

Figure 3B:
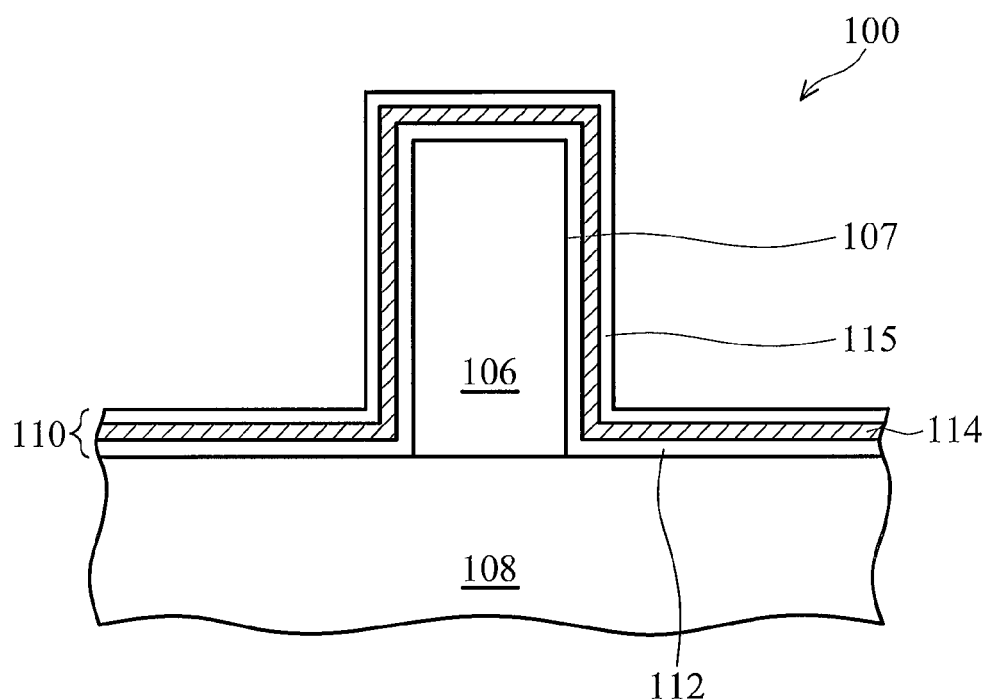

With reference to FIG. 3B, an oxide-nitride-oxide (ONO) layer 110 has been formed over the silicon substrate 108. The ONO layer 110 may also be referred to as an ONO stack 110. To form the ONO stack 110, a bottom oxide material is grown over the silicon substrate 108. The growth of the bottom oxide material 112 is followed by a silicon nitride (SiN) material 114 deposition. The deposition of the SiN material 114 is followed by the growth of a top oxide material 115. Other illustrative embodiments of the present invention include a plurality of methods and materials (not shown) to form the ONO layer 110.

Preferably, the ONO layer 110 shown in FIG. 3B is substantially conformal and immediately adjacent to underlying features of the gate stack 106 and the silicon substrate 108. The bottom oxide material 112 is preferably a tunneling oxide 112, the charge storing material 114 is preferably a silicon nitride (SiN) material 114, and the top oxide 115 is preferably a sacrificial oxide material 115. The charge storing material 114 may also be referred to as a charge trapping material 114.

Figure 3C:
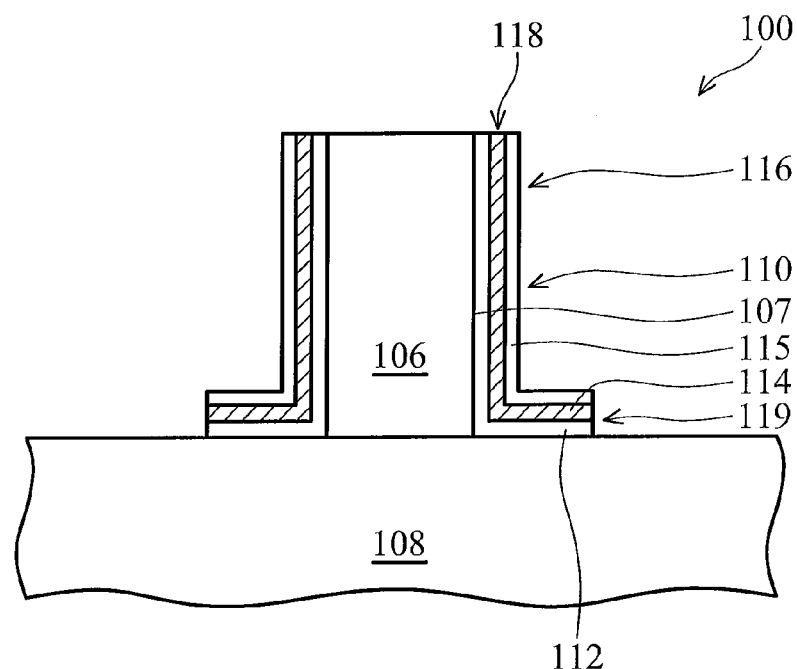

With reference to FIG. 3C, the cross-sectional view of the transistor 100 of the first embodiment is shown after a pattern and etch step has removed portions of the ONO layer 110. In the first embodiment, portions of the tunneling oxide 112, the SiN 114, and the sacrificial oxide 115 are all removed in the same etch step. However, portions of the ONO layer 110 may be removed in any suitable manner for other embodiments.

FIG. 3C illustrates that a remaining portion 116 of the ONO layer 110 is an oxide-nitride-oxide (ONO) structure 116. The ONO structure 116 has a generally L-shaped cross-section. The nitride material 114 in the L-shaped ONO structure 116 is a storage film 114 capable of storing and trapping an electric charge. The ONO structure 116 has a vertical portion 118 substantially aligned with and immediately adjacent to the gate stack sidewall 107. The ONO structure 116 also has a horizontal portion 119 substantially aligned with and immediately adjacent to the silicon substrate 108.

Figure 3D:
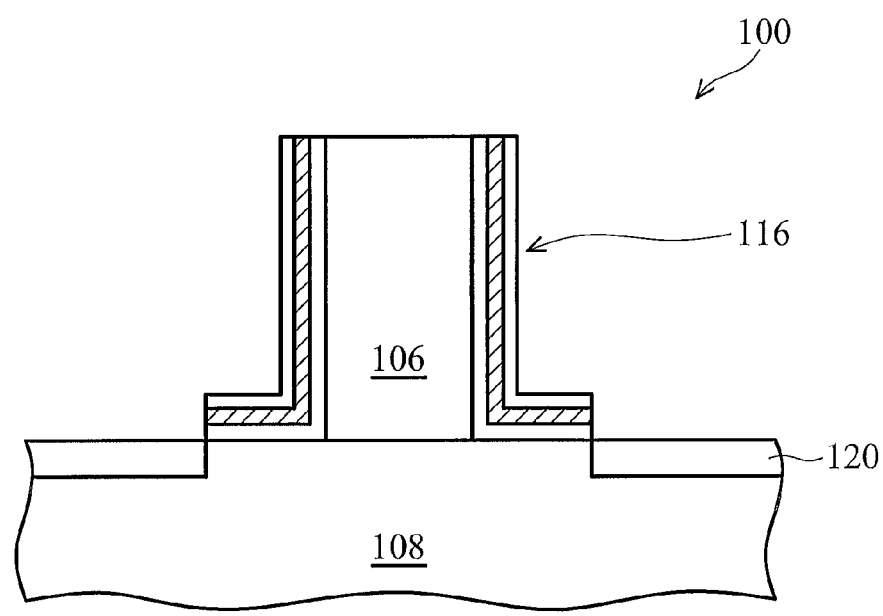

FIG. 3D shows the cross-sectional view of the sidewall SONOS transistor 100 following the formation of a lightly doped drain (LDD) region 120, in accordance with the preferred illustrative embodiment. The LDD region 120 may be formed by implanting a dopant material (not shown), for example. The LDD region 120 may also be referred to as a source/drain extension (SDE) region 120, and may be an n-type material, for example. Preferably, the LDD region 120 is directly adjacent the oxide-nitride-oxide structure 116.

Figure 3E:
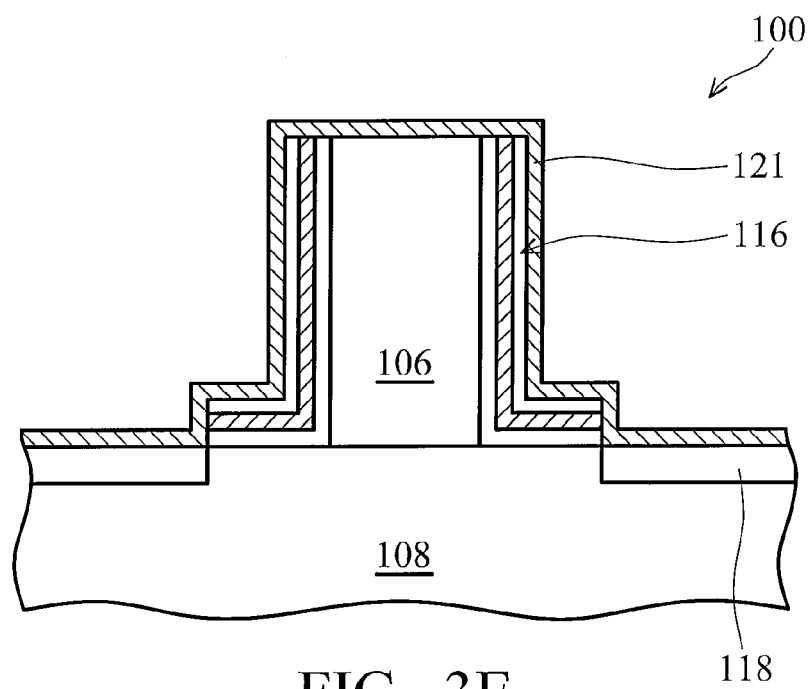

FIG. 3E shows the sidewall SONOS transistor 100 of the present invention following the growth of a dielectric material 121 over the silicon substrate 108. The dielectric material 121 is preferably a logic oxide 121. However, the dielectric material 121 may be any type of dielectric material in other embodiments, which has a characteristic of less charge trapping than the charge storage layer 114. Preferably, the logic oxide material 121 is substantially conformal to features of gate stack 106 and ONO structure 116, and on the silicon substrate 108. The logic oxide 121 may also be referred to as a logic spacer oxide, or a spacer oxide, for example.

Figure 3F:
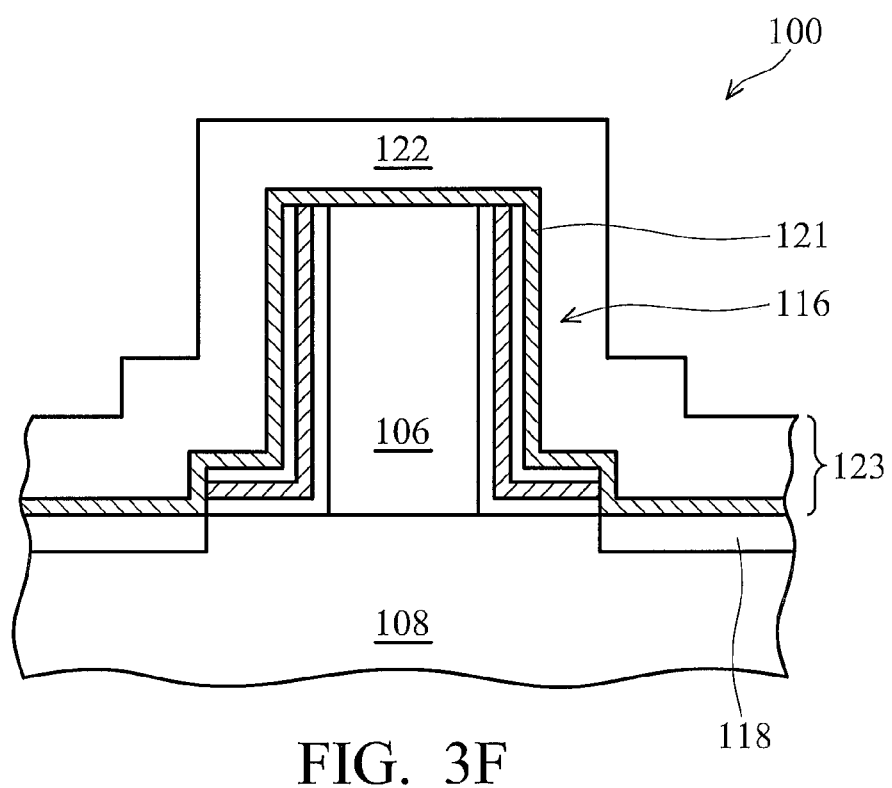

FIG. 3F shows a cross-sectional view of the sidewall SONOS transistor 100, following the deposition of a spacer material 122 directly over the logic oxide material 121, in accordance with the first embodiment. Preferably, the spacer material 122 is a silicon nitride (SiN) spacer material 122, however the spacer material 122 may be any material suitable for the formation of a gate spacer. The SiN spacer material 122 is substantially conformal to the features of gate stack 106 and the ONO structure 116 in and on the silicon substrate 108. The logic oxide material 121 and the SiN spacer material 122 may be referred to collectively as logic materials 123.

Figure 3G:
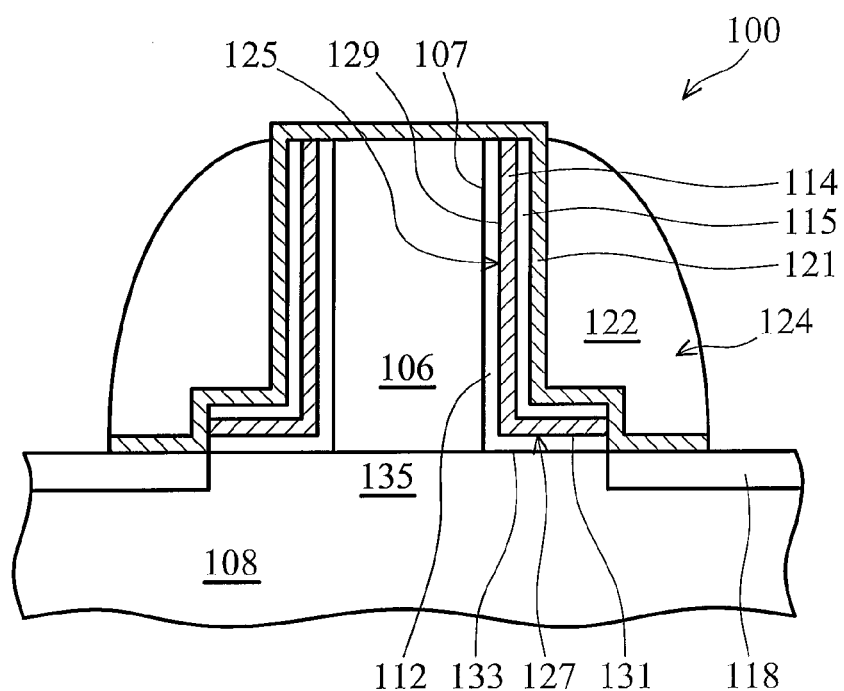

With reference to FIG. 3G, a cross-sectional view of the sidewall SONOS transistor 100 following an etch step is illustrated. The etch step is preferably a logic spacer etch step. The logic spacer etch step has removed portions of the logic oxide material 121 and the SiN spacer material 122, to form a SiN spacer 124 adjacent to and separated from the storage film 114 by the logic oxide material 121 and the sacrificial oxide 115.

As shown in FIG. 3G, the storage film 114 of the preferred illustrative embodiment is formed in a manner that promotes reliable functionality of the sidewall SONOS transistor 100 during operation. The storage film 114 is suitably sized to significantly reduce and substantially eliminate electron drift in the storage film 114 during operation. The mitigated electron drift in the storage film 114 results in enhanced charge density retention for the sub-0.130 µm transistor 100, thus enhancing the reliability of the device in which it is used (e.g., a flash card).

With continuing reference to the first embodiment shown in FIG. 3G, the L-shaped storage film 114 has two portions, portion 125 and portion 127. The portion 125 has a substantially planar surface 129 that is substantially parallel to the sidewall 107 of the gate stack 106. The planar surface 129 of the storage film portion 125 is separated from the gate stack sidewall 107 by the tunneling oxide material 112. The storage film portion 127 has a planar surface 131 substantially parallel to a planar surface 133 of the channel region 135 in the silicon substrate 108. The planar surface of the storage film portion 127 is separated from the surface 131 of the channel region 135 by the tunneling oxide 112.

The storage film 114 of the first embodiment in FIG. 3G is encapsulated in oxide materials 112, 115, and 121, which is preferred. The storage film 114 is electrically isolated from the SiN spacer 124 by the sacrificial oxide 115 and by the logic oxide material 121. Electric isolation of the storage film 114 from the SiN spacer 124 prevents unwanted electromagnetic effects that may otherwise be imposed on the storage film 114 by the SiN spacer 124 during operation. The SiN logic spacer 124 physically protects the storage film 114 and the gate stack 106 from subsequent potentially harmful and stressful manufacturing steps (i.e., contact formation).

Figure 3H:
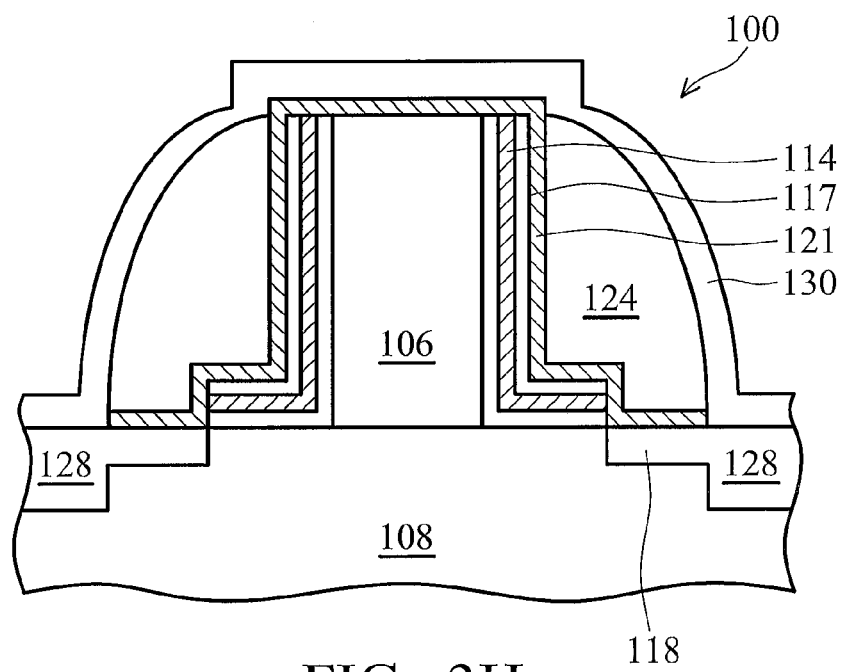

FIG. 3H shows a cross-sectional view of the transistor 100 of the first embodiment after further manufacturing steps, including the step of forming a deep source/drain region 128 and depositing a sacrificial layer 130, also known as a conformal SiN contact etch stop layer (CESL) 130. The source/drain region 128 is formed by implanting a dopant material (not shown) into the substrate 108. The dopant material in the source/drain region 128 is an n-type material, in this example. Following source/drain region 128 formation, a substantially conformal SiN contact etch stop layer (CESL) 130 is formed over the silicon substrate 108. FIG. 3H illustrates that the logic oxide material 121 separates the storage film 114 from the overlying CESL layer 130, thus providing substantial electrical isolation to the storage film 114 from the CESL layer 130.

Illustrative embodiments of the present invention include non-volatile memory systems (i.e., a flash memory stick, and a flash memory card) comprising the sidewall SONOS memory transistor 100. The transistor 100 may also be referred to as a sub-0.130 µm semiconductor memory device 100. Still other illustrative embodiments include electronic devices comprising non-volatile random access memory (NVRAM), in which the sub-0.130 µm semiconductor memory device 100 resides. Other illustrative embodiments include the transistor 100 in other electronic devices, such as digital video recorder (DVR) systems, digital cameras, digital audio recorders and players, laptops, desktops, navigation systems, military defense systems, communications systems such as cellular technology, and computer networks, for example.

Another embodiment of the present invention, illustrated in FIGS. 4A-4E, provides a method of manufacturing a sidewall SONOS memory device. The cross-sectional views in FIGS. 4A-4E show the sidewall SONOS transistor 140 at various stages of a semiconductor manufacturing process.

Figure 4A:
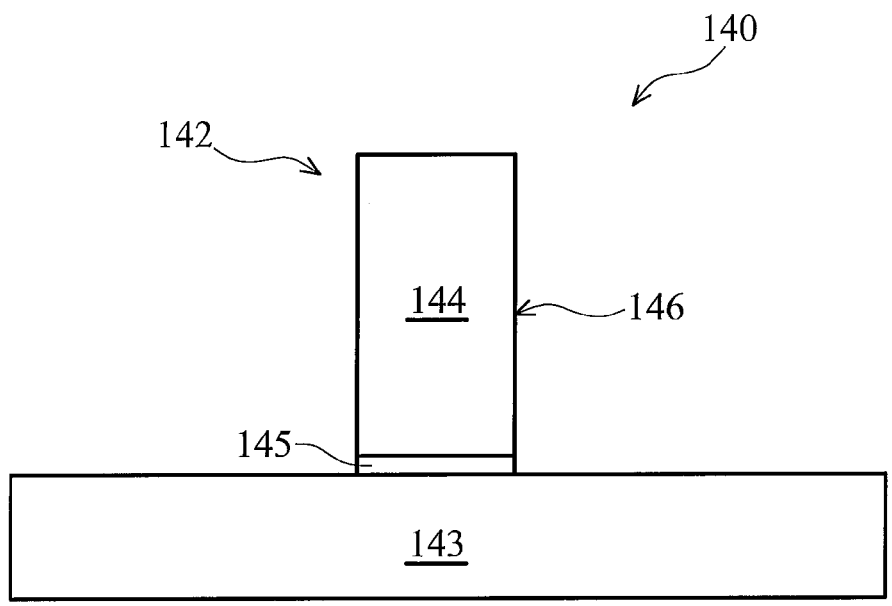
FIGS. 4A-4E show cross-sectional views of the non-volatile semiconductor memory device of another illustrative embodiment at various stages of manufacturing.
Figure 4B:
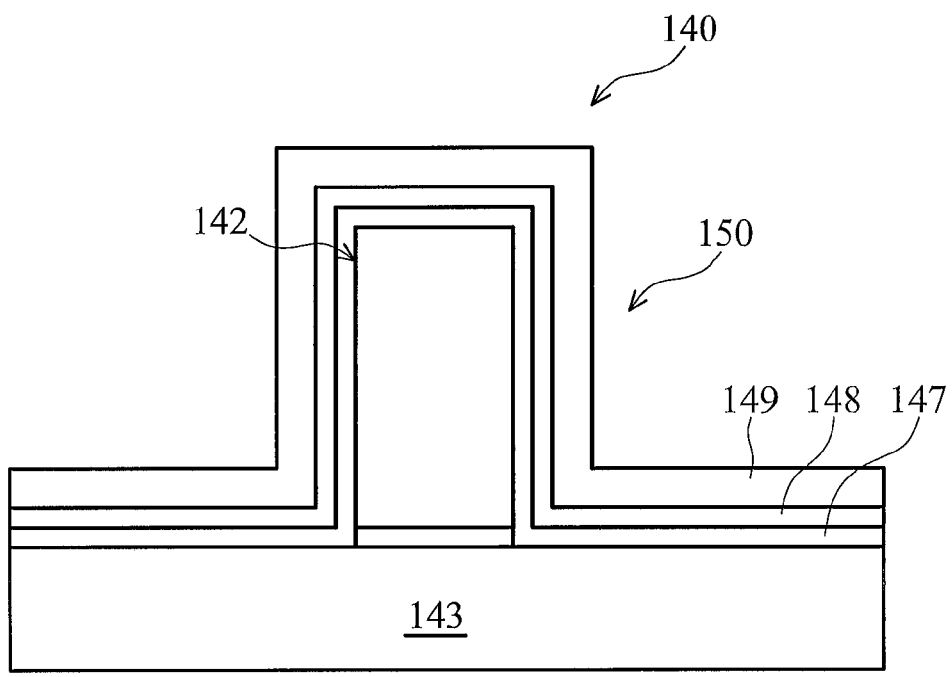

As shown in FIG. 4A, a gate stack 142 is formed on a substrate 143. The gate stack 142 has a gate electrode 144, a gate dielectric 145, and a sidewall 146. As shown in FIG. 4B, a bottom oxide 147 is formed over the substrate 143. The bottom oxide 147 may be a tunneling oxide, for example. A storage layer 148 is formed on the bottom oxide 147. The storage layer 148 may be a nitride layer, for example. The sacrificial oxide layer 149 is deposited over the nitride storage layer 148. The combination of the bottom oxide 147, the nitride storage layer 148, and the sacrificial oxide layer 149 may be referred to collectively as an oxide-nitride-oxide (ONO) layer 150. FIG. 4B shows that the ONO layer 150 has been deposited conformably over the substrate 143, and including on the gate stack 142 of the sidewall SONOS transistor 140.

Figure 4C:
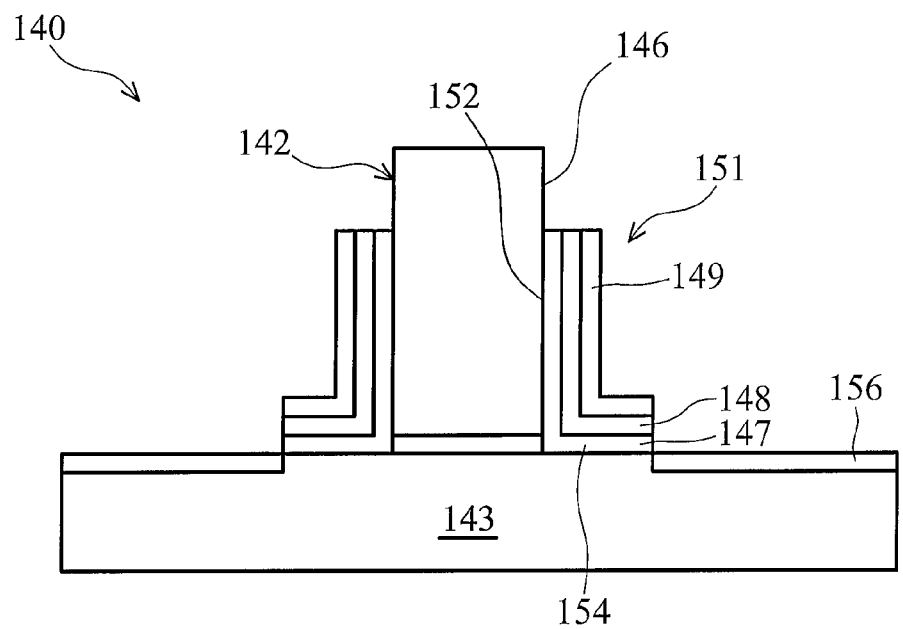

In FIG. 4C, portions of the oxide-nitride-oxide layer 150 (see FIG. 4B) have been removed to form an oxide-nitride-oxide structure 151. The removed portion is preferably no greater than ⅔ of the height of gate electrode 144. The oxide-nitride-oxide structure 151 has a generally L-shaped cross-section with a vertical portion 152 along at least part of the gate stack sidewall 146 and a horizontal portion 154 along the substrate 143. A lightly doped drain (LDD) region 156 has been formed in the substrate 143. The LDD region 156 is aligned with the oxide-nitride-oxide structure 151.

Figure 4D:
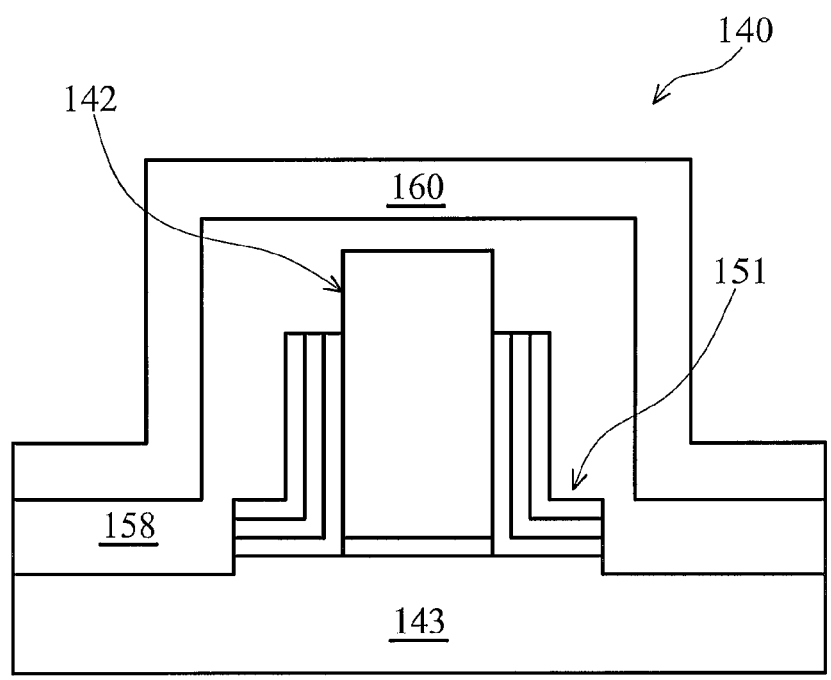
Figure 4E:
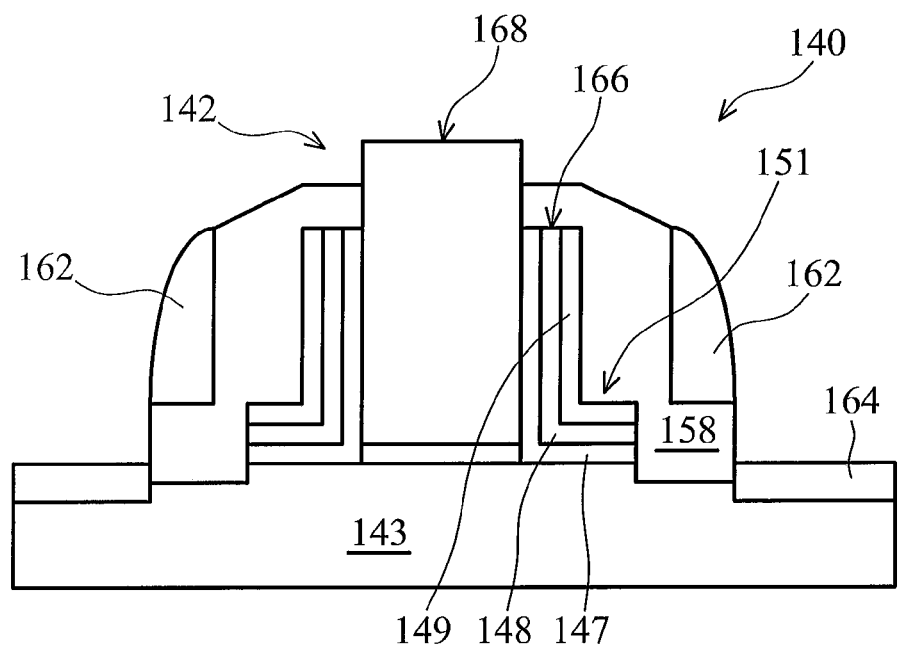

FIG. 4D shows a top oxide material 158 deposited over the substrate 143. Also shown in FIG. 4D, silicon nitride spacer material 160 is deposited over the top oxide material 158. FIG. 4E shows the SONOS transistor 140 after portions of the top oxide 158 and the silicon nitride spacer material 160 (see FIG. 4D) have been removed to form a silicon nitride spacer 162 separated from the oxide-nitride-oxide structure 151 by the top oxide material 158. Source/drain regions 164 are formed in the substrate 143. The top 166 of the oxide-nitride-oxide structure 151 is recessed relative to a top 168 of the gate stack 142. In another embodiment of the present invention shown in FIG. 4F, the top 166 of the oxide-nitride-oxide structure 151 is recessed relative to the top 170 of the nitride spacer 162.

Figure 4F:
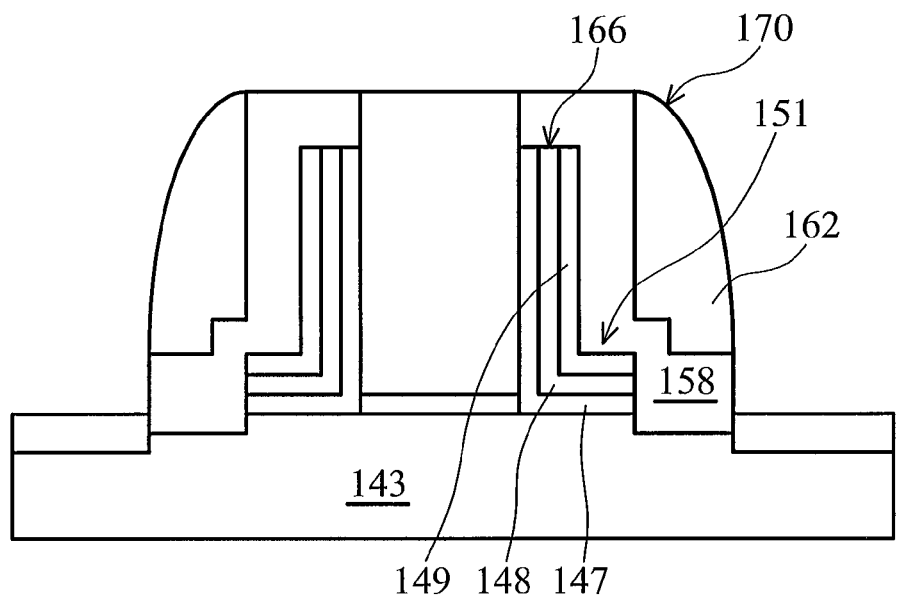
FIG. 4F shows a cross-sectional view of an illustrative embodiment of the present invention.

As shown in FIGS. 4E and 4F, the nitride storage layer 148 in the oxide-nitride-oxide structure 151 is enclosed by oxide materials. In both FIG. 4E and FIG. 4F, the nitride material 148 is enclosed by the bottom tunneling oxide 147, the sacrificial oxide 149, and the top oxide 158. An advantage is achieved by the isolation of the nitride storage layer 148 in the present embodiment. The enclosure of the nitride storage layer 148 with dielectric layers 147, 149, and 158 prevents undesired electromagnetic effects on any charge stored in the nitride storage layer 148.

Another embodiment of the present invention, illustrated in FIGS. 5A-5E, provides a method of manufacturing a sidewall SONOS memory device. The cross-sectional views in FIGS. 5A-5E show the sidewall SONOS transistor 180 at various stages of a semiconductor manufacturing process.

Figure 5A:
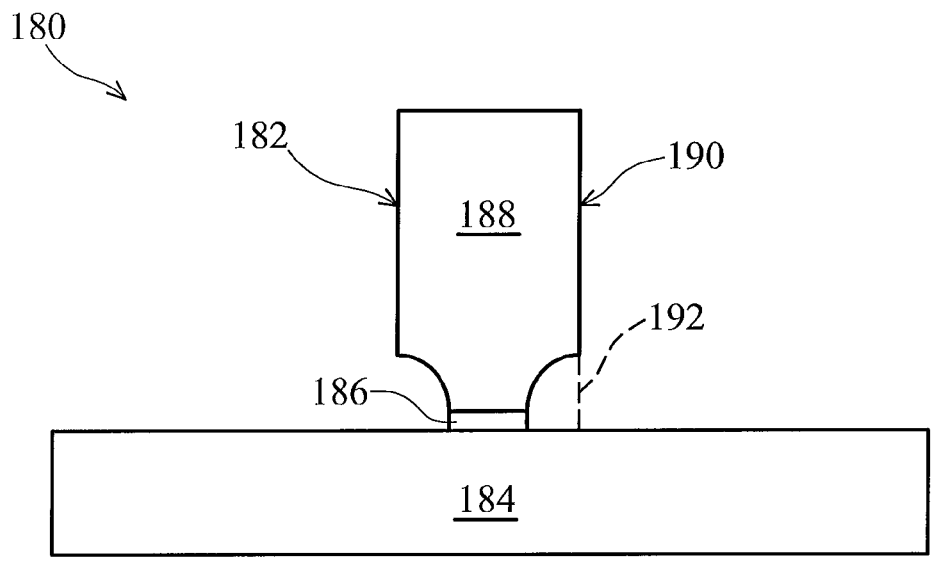
FIGS. 5A-5E show cross-sectional views of the non-volatile semiconductor memory device of yet another illustrative embodiment at various stages of manufacturing.
Figure 5B:
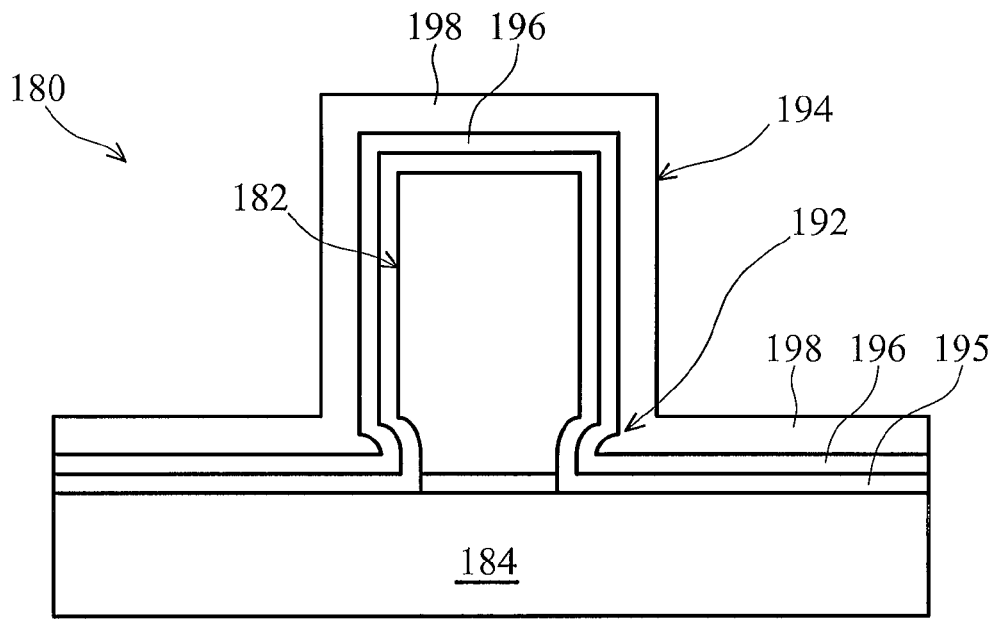

In FIG. 5A, a gate stack 182 is formed on a substrate 184. The gate stack 182 includes a gate dielectric 186, a gate electrode 188, and a sidewall 190. A recess 192 is formed in a lower portion of the sidewall 190. For illustrative purposes, the recess 192 is shown in FIG. 5A with a dotted line. As shown in FIG. 5B, an oxide-nitride-oxide material 194 is conformably deposited over the substrate 184, including being conformably formed on the gate stack 182 and in the gate stack recess 192. The oxide-nitride-oxide material 194 includes three layers: a tunneling oxide layer 195, a nitride layer 196, and a sacrificial oxide layer 198.

Figure 5C:
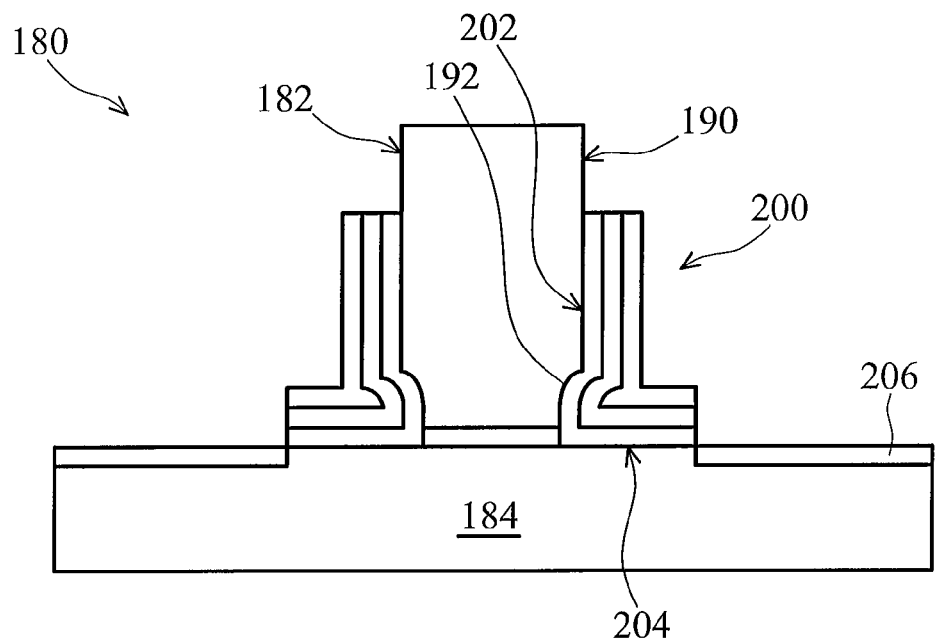

In FIG. 5C, portions of the oxide-nitride-oxide material 194 (see FIG. 5B) are removed to form an oxide-nitride-oxide structure 200. The oxide-nitride-oxide structure 200 has a generally L-shaped cross-section. The oxide-nitride-oxide structure 200 is conformably formed in the recessed portion 192 of the gate stack sidewall 190. A vertical portion 202 of the oxide-nitride-oxide structure 200 is formed along at least part of the gate stack sidewall 190, including in the recessed portion 192. The horizontal portion 204 of the oxide-nitride-oxide structure 200 is formed along the substrate 184. A lightly doped drain (LDD) region 206 has been formed in the substrate 184. The LDD region 206 is aligned with the oxide-nitride-oxide structure 200.

Figure 5D:
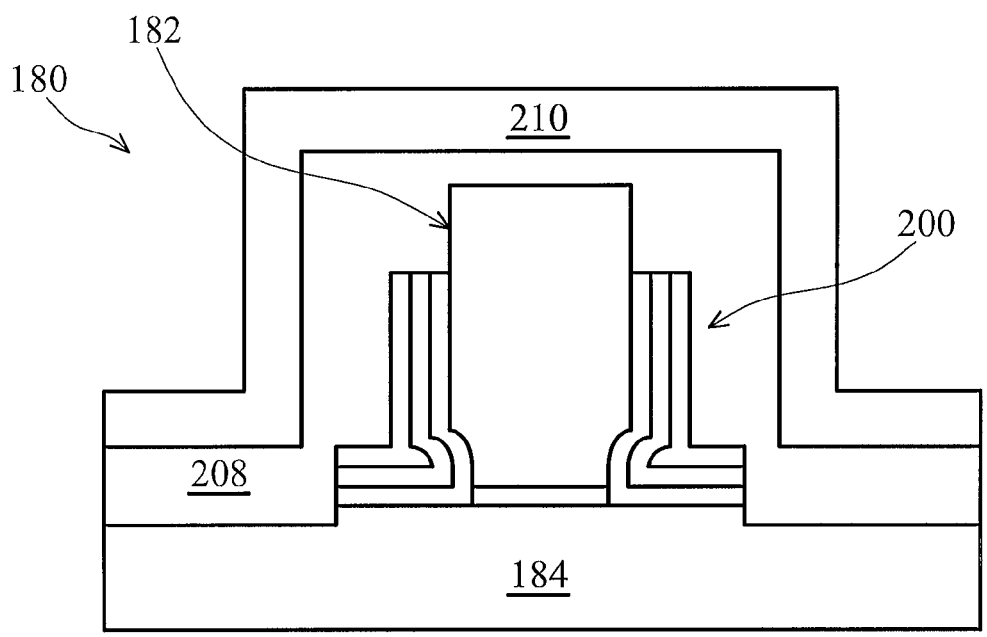
Figure 5E:
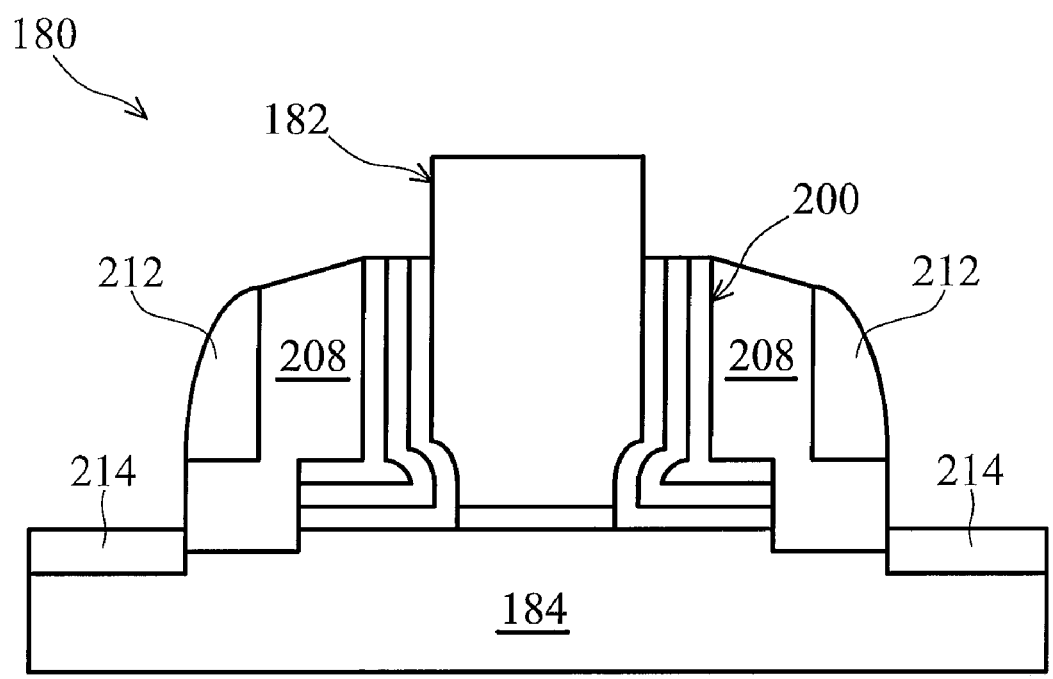

FIG. 5D shows a top oxide material 208 deposited over the substrate 184. A silicon nitride spacer material 210 is deposited over the top oxide material 208. FIG. 5E shows the SONOS transistor 180 after portions of the top oxide material 208 and the silicon nitride spacer material 210 (see FIG. 5D) have been removed to form a silicon nitride spacer 212 separated from the oxide-nitride-oxide structure 200 by the top oxide material 208. Source/drain regions 214 are formed in the substrate 184. The source/drain regions 214 are substantially self-aligned with the spacers 212.

Yet another embodiment of the present invention, illustrated in FIGS. 6A-6E, provides a method of manufacturing a sidewall SONOS memory device. The cross-sectional views in FIGS. 6A-6E show the sidewall SONOS transistor 220 at various stages of a semiconductor manufacturing process.

Figure 6A:
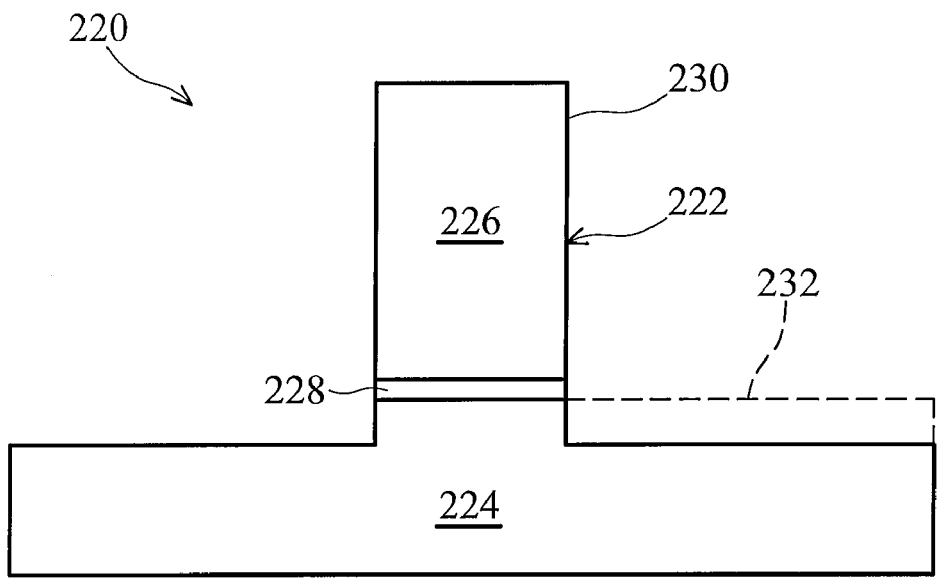
FIGS. 6A-6E show cross-sectional views of the non-volatile semiconductor memory device of still another illustrative embodiment at various stages of manufacturing.

With reference to FIG. 6A, a gate stack 222 is formed on the substrate 224. The gate stack 222 has a gate electrode 226, a gate dielectric 228, and a sidewall 230. A substrate recess 232 is formed adjacent the gate stack 222. The substrate recess 232 is outlined with a dashed line for illustrative purposes, and the dashed line may not be readily apparent in the final product.

Figure 6B:
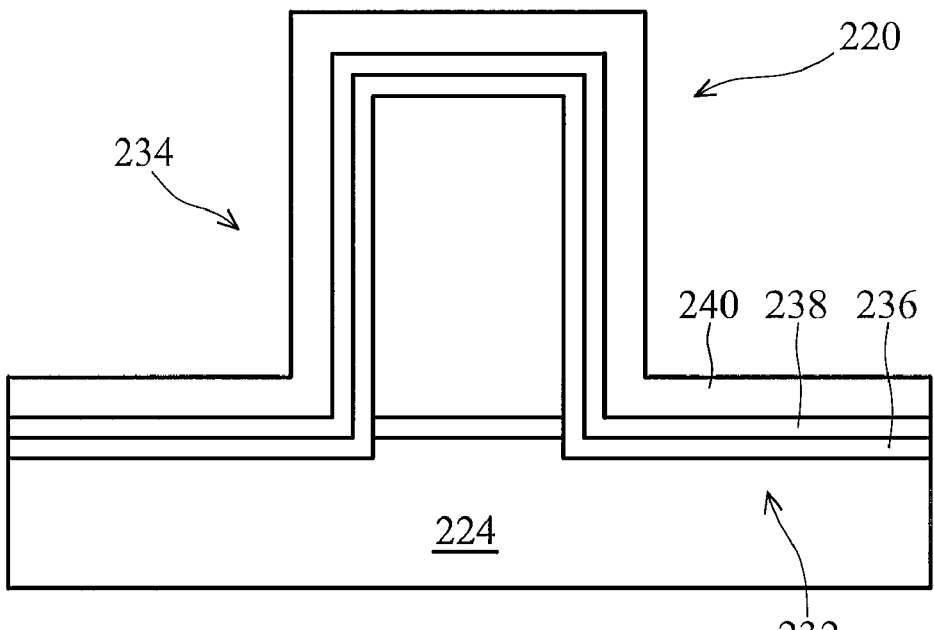

In FIG. 6B, the oxide-nitride-oxide material 234 has been deposited over the substrate 224. The oxide-nitride-oxide material 234 includes a tunneling oxide layer 236, a nitride layer 238, and a sacrificial oxide layer 240.

Figure 6C:
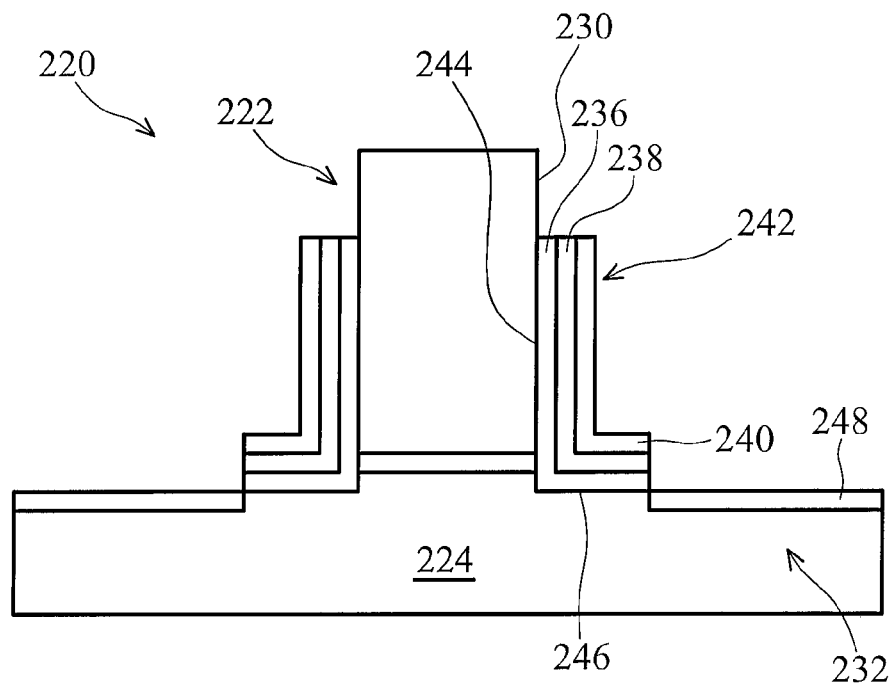

As illustrated in FIG. 6C, portions of the oxide-nitride-oxide material 234 (see FIG. 6B) are removed to form an oxide-nitride-oxide structure 242. The oxide-nitride-oxide structure 242 has a generally L-shaped cross-section with a vertical portion 244 along at least part of the gate stack sidewall 230 and a horizontal portion 245 along the substrate 224. A lightly doped drain (LDD) region 247 has been formed in the substrate 224. The LDD region 247 is aligned with the oxide-nitride-oxide structure 242.

Figure 6D:
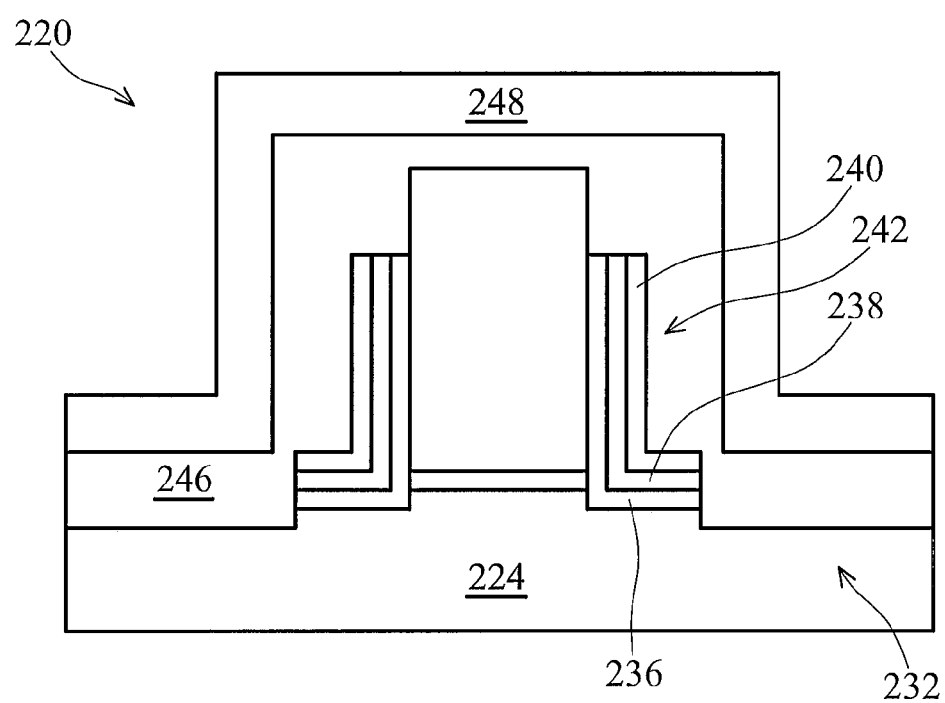
Figure 6E:
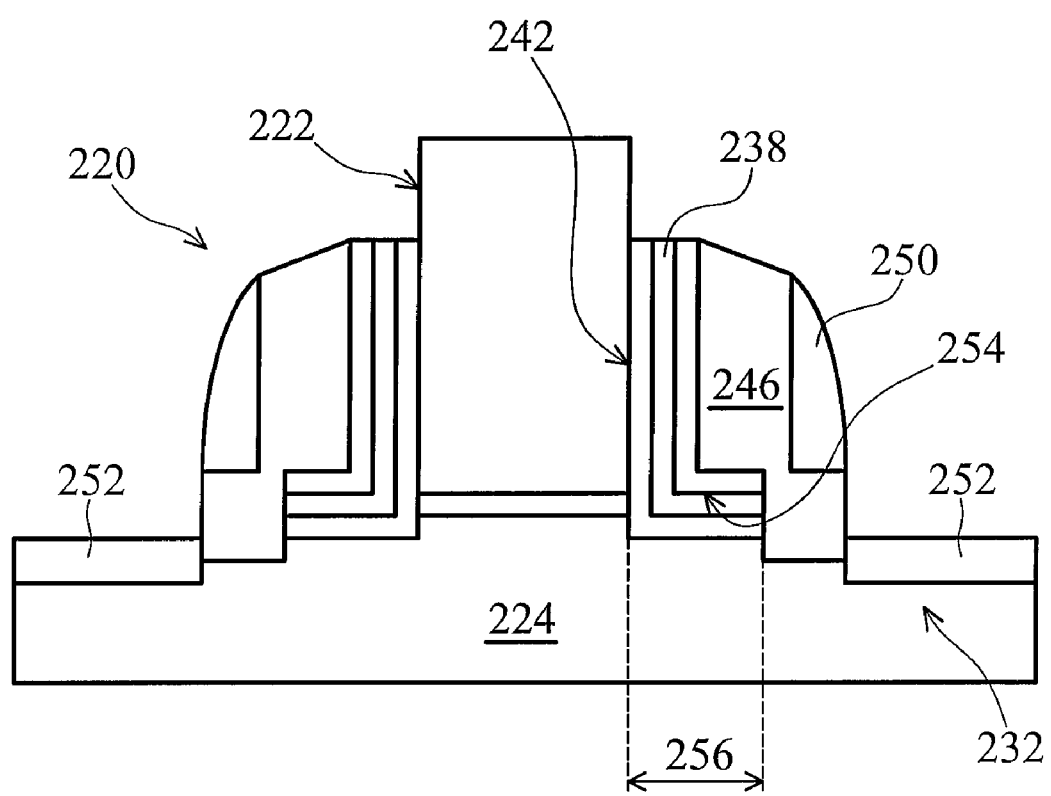

Referring now to FIG. 6D, the top oxide material 246 is deposited over the substrate 224. A silicon nitride spacer material 248 is deposited over the top oxide material 246. FIG. 6E shows the SONOS transistor 220 after portions of the top oxide material 246 and the silicon nitride spacer material 248 (see FIG. 6D) have been removed to form a silicon nitride spacer 250. The spacer 250 is separated from the oxide-nitride-oxide structure 242 by the top oxide material 246. Source/drain regions 252 are formed in the substrate 224.

Continuing with FIG. 6E, the length 256 of the substrate side 254 of the nitride storage material 238 in the oxide-nitride-oxide structure 242 may be controlled by a dry etch process, for example. The length 256 of the substrate side 254 of the nitride storage material 238 is preferably between about 30 angstroms and about 700 angstroms, although embodiments may include any suitable length.

In yet another embodiment of the present invention, illustrated in FIGS. 7A-7G, a method of manufacturing a sidewall SONOS memory device is described. The cross-sectional views in FIGS. 7A-7G show the sidewall SONOS transistor 260 at various stages of a semiconductor manufacturing process.

Figure 7A:
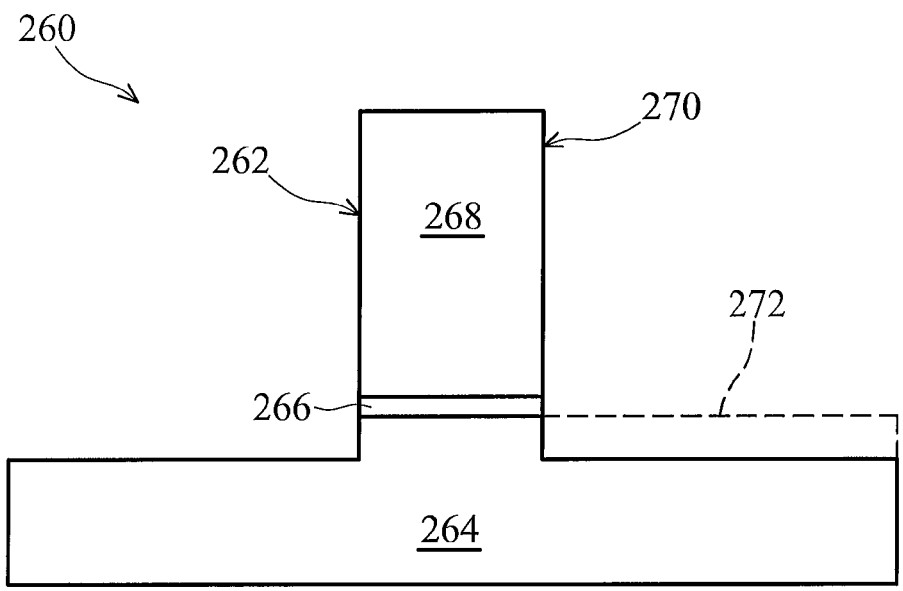
FIGS. 7A-7G show cross-sectional views of the non-volatile semiconductor memory device of yet another illustrative embodiment at various stages of manufacturing.
Figure 7B:
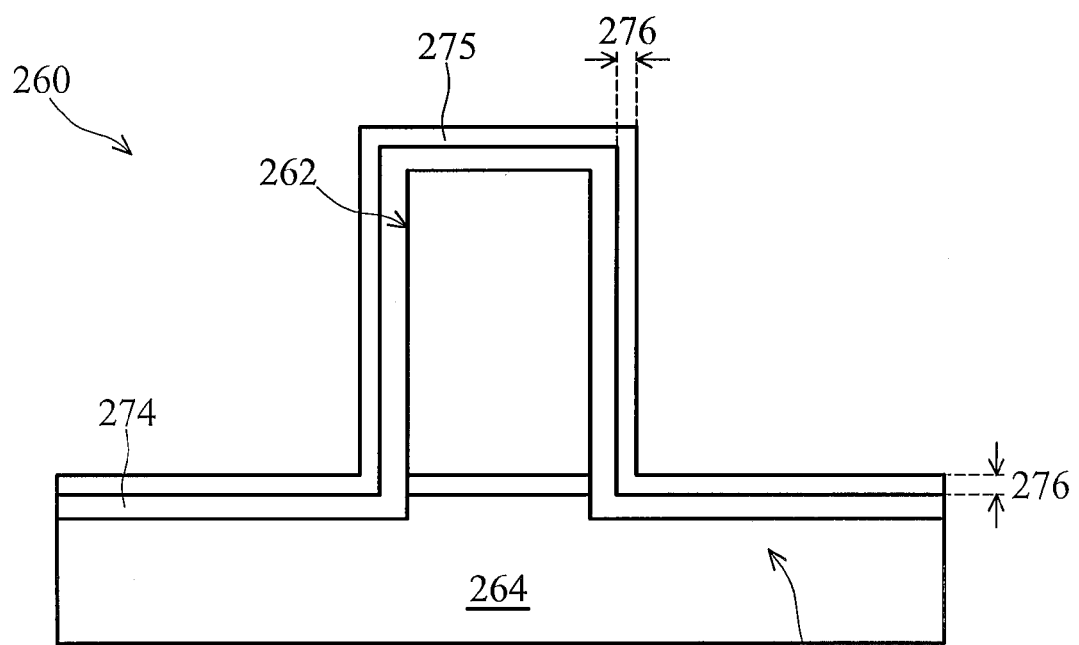

With reference to FIG. 7A, the gate stack 262 is formed on the substrate 264. The gate stack 262 has a gate dielectric 266, a gate electrode 268, and a sidewall 270. A substrate recess 272 is formed in the substrate 264 adjacent to the gate stack 262. FIG. 7B shows the sidewall SONOS transistor 260 after a tunneling oxide material 274 has been deposited over the substrate 264, including being conformably formed on the gate stack 262 and in the substrate recess 272. A nitride storage material 275 has been deposited on the tunneling oxide material 274. The thickness 276 of the nitride storage material 275 in embodiments of the present invention may be controlled by any suitable semiconductor manufacturing process, including (but not limited to) a chemical vapor deposition process, for example. The thickness of a nitride storage layer in embodiments of the present invention is preferably between about 30 angstroms and about 200 angstroms, for example, but may also be any suitable thickness.

Figure 7C:
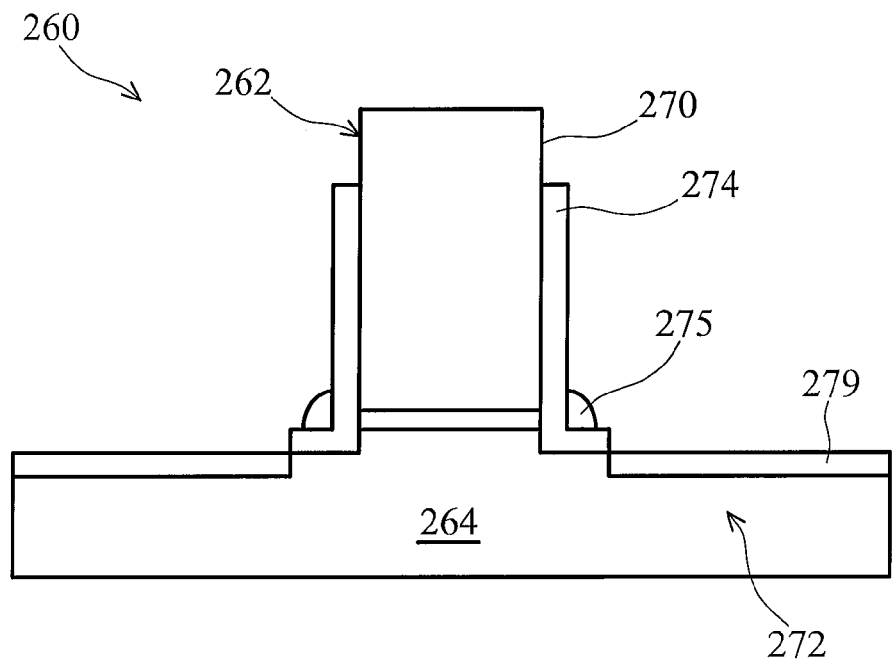

As shown in FIG. 7C, portions of the tunneling oxide material 274 and of the nitride material 275 are removed. The tunneling oxide material 274 is extended adjacent to the gate stack 262 and is extended adjacent to the substrate 264. The nitride material 275 is formed in an inner corner of the tunneling oxide material 274, and the nitride material 275 has a generally quarter-round shaped cross-section. The LDD region 279 is aligned with the tunneling oxide material 274.

Figure 7D:
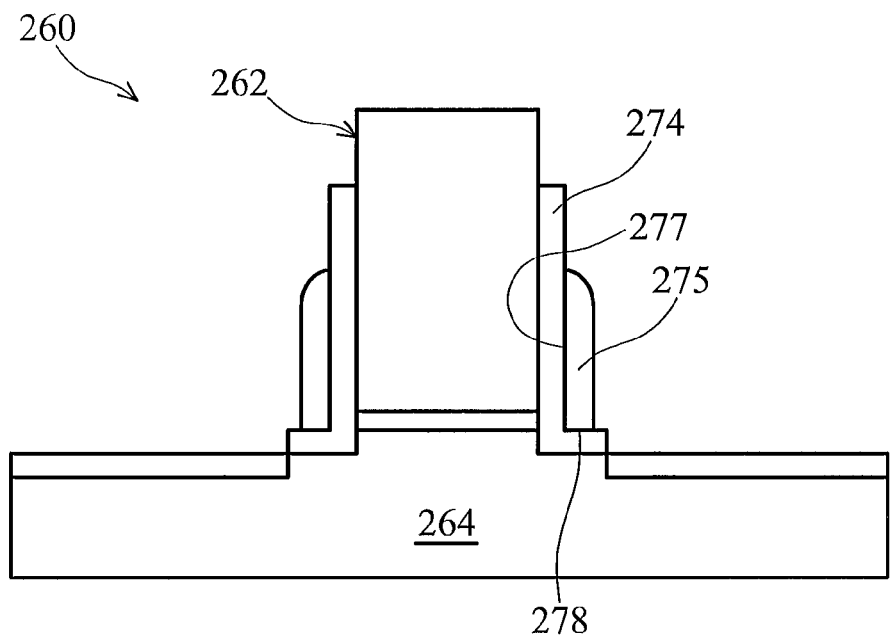
Figure 7E:
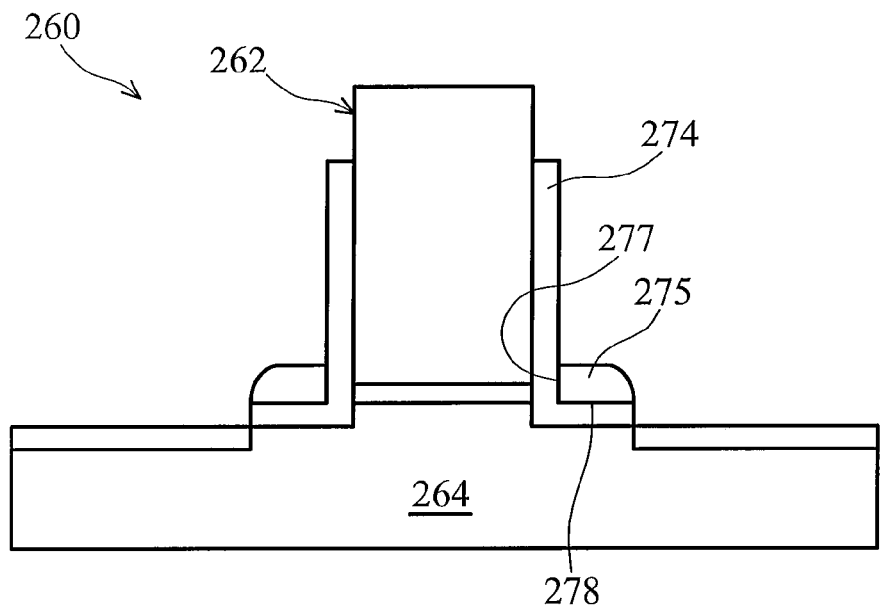

Although the nitride storage material 275 in the present embodiment has a generally quarter-round shaped cross-section, the nitride storage material 275 may have any shape. FIG. 7D shows an illustrative embodiment of the present invention in which a gate-stack side 277 of the nitride storage material 275 is longer than a substrate side 278 of the nitride storage material 275. FIG. 7E shows an illustrative embodiment of the present invention in which a substrate side 278 of the nitride storage material 275 is longer than a gate-stack side 277 of the nitride storage material 275. A lightly doped drain (LDD) region 279 has been formed in the substrate.

Figure 7F:
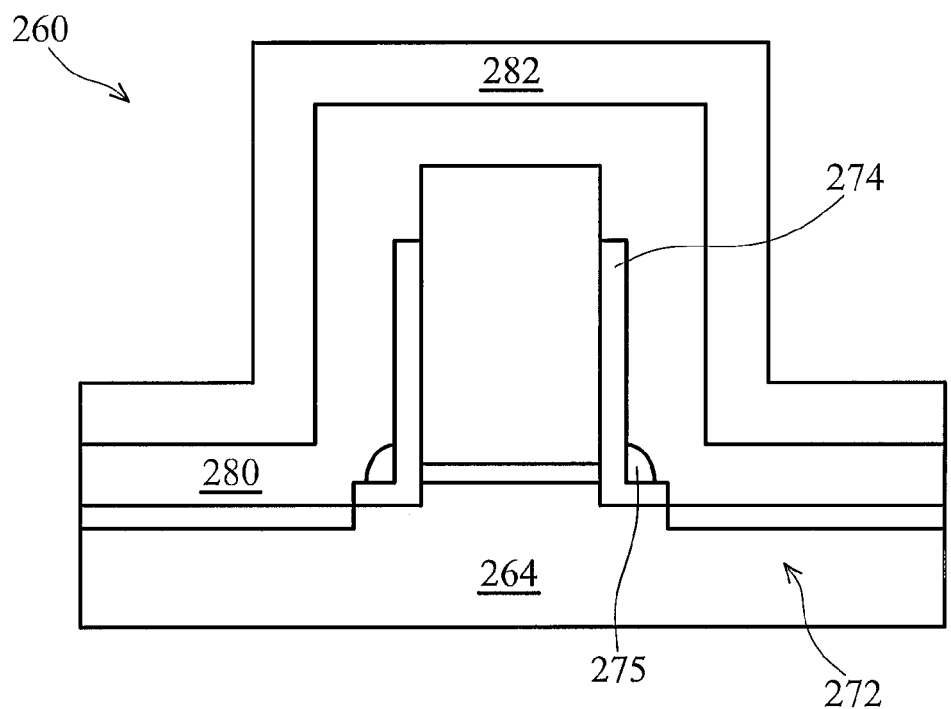
Figure 7G:
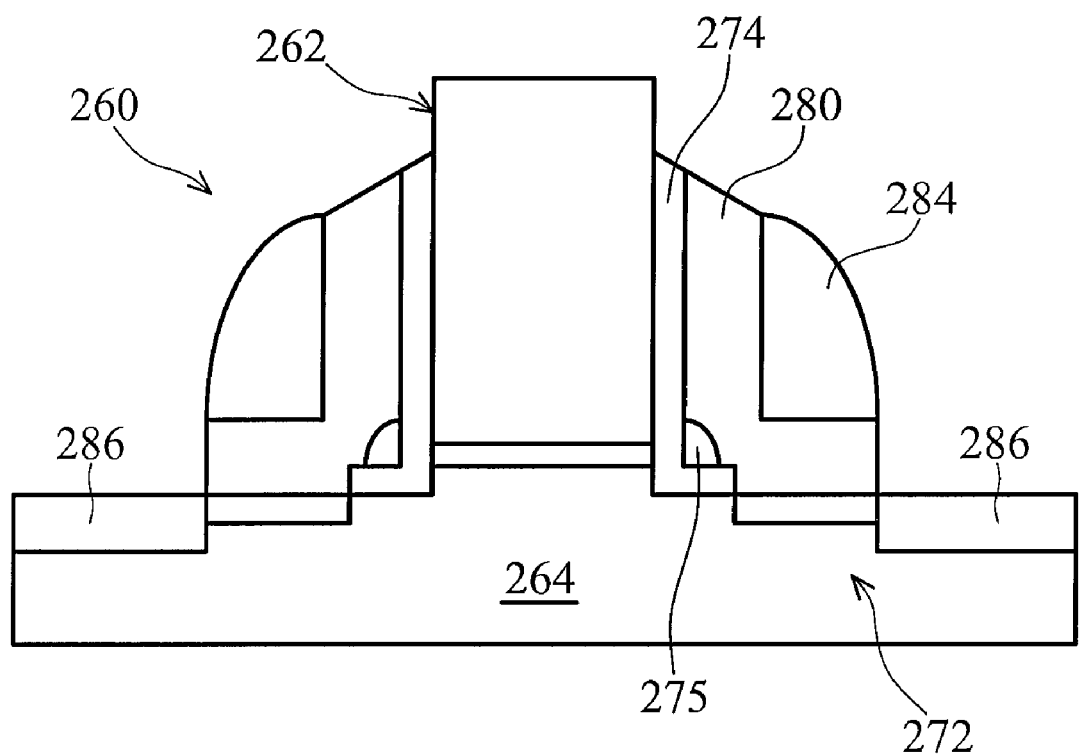

Referring now to FIG. 7F, a top oxide material 280 is deposited over the substrate 264. A silicon nitride spacer material 282 is deposited over the top oxide material 280. FIG. 7G illustrates that portions of the top oxide material 280 and the silicon nitride spacer material 282 are removed to form a silicon nitride spacer 284. The silicon nitride spacer 284 is separated from the tunneling oxide material 274 and the nitride storage material 275 by the top oxide material 280. Source/drain regions 286 aligned with the nitride spacer 284 are formed in the substrate 264. The nitride material 275 is enclosed in the tunneling oxide material 274 and the top oxide material 280.

Still another embodiment of the present invention, illustrated in FIGS. 8A-8E, provides a method of manufacturing a sidewall SONOS memory device. The cross-sectional views in FIGS. 8A-8E show the sidewall SONOS transistor 290 at various stages of a semiconductor manufacturing process.

Figure 8A:
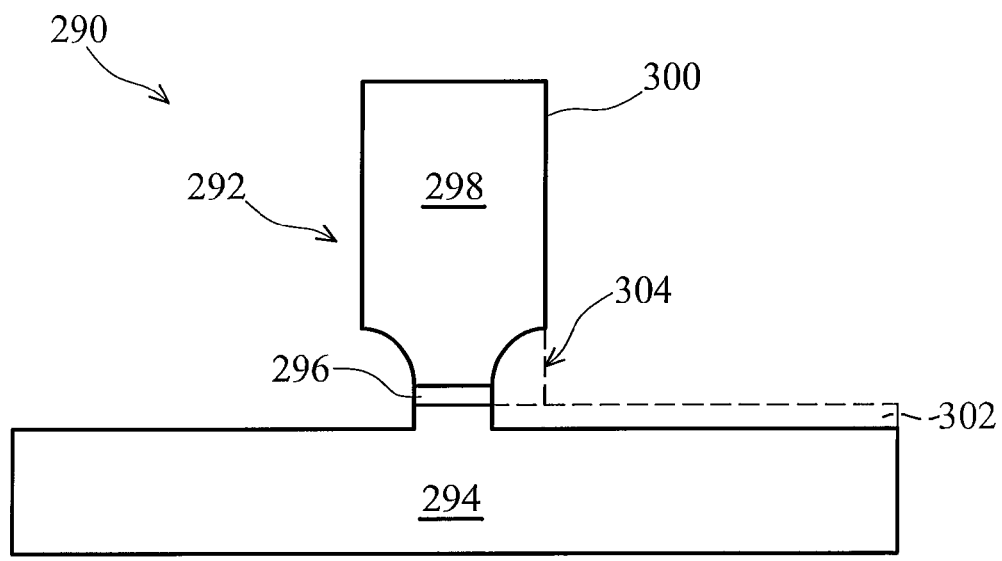
FIGS. 8A-8E show cross-sectional views of the non-volatile semiconductor memory device of still another illustrative embodiment at various stages of manufacturing.

With reference now to FIG. 8A, a gate stack 292 is formed on a substrate 294. The gate stack 292 has a gate dielectric 296 interposed between the substrate 294 and the gate electrode 298. A side of the gate stack 292 forms a sidewall 300. A substrate recess 302 is formed adjacent the gate stack 292. A gate stack recess 304 is formed in a lower portion of the sidewall 300. Dotted lines outline the gate stack recess 304 and the substrate recess 302. The dotted lines are merely for illustrative purposes and may not be readily apparent in the final product.

Figure 8B:
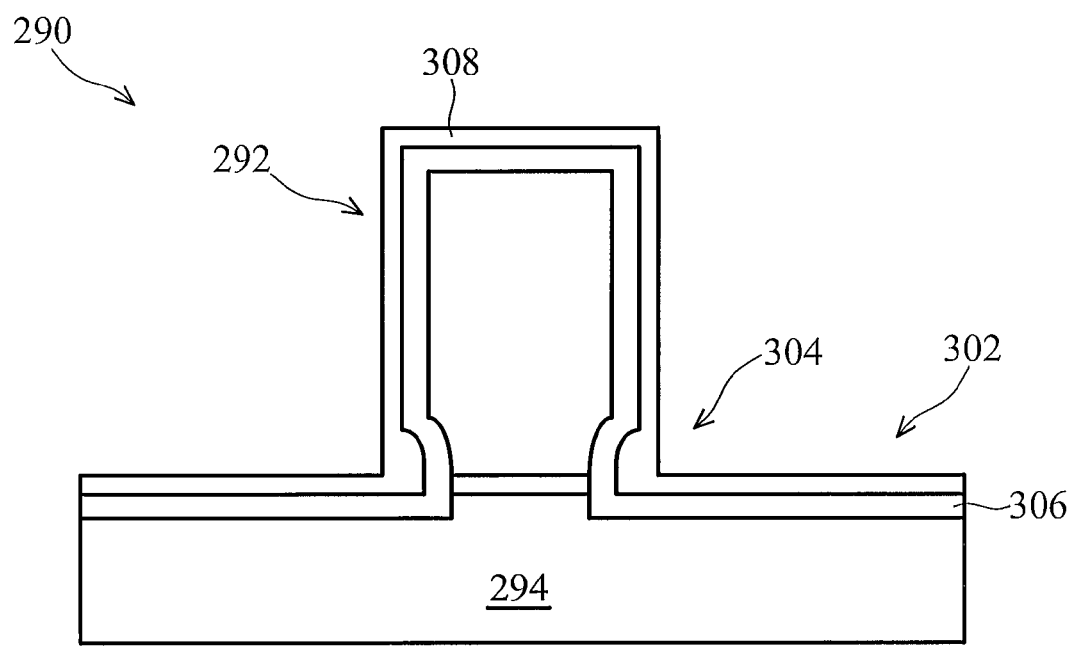
Figure 8C:
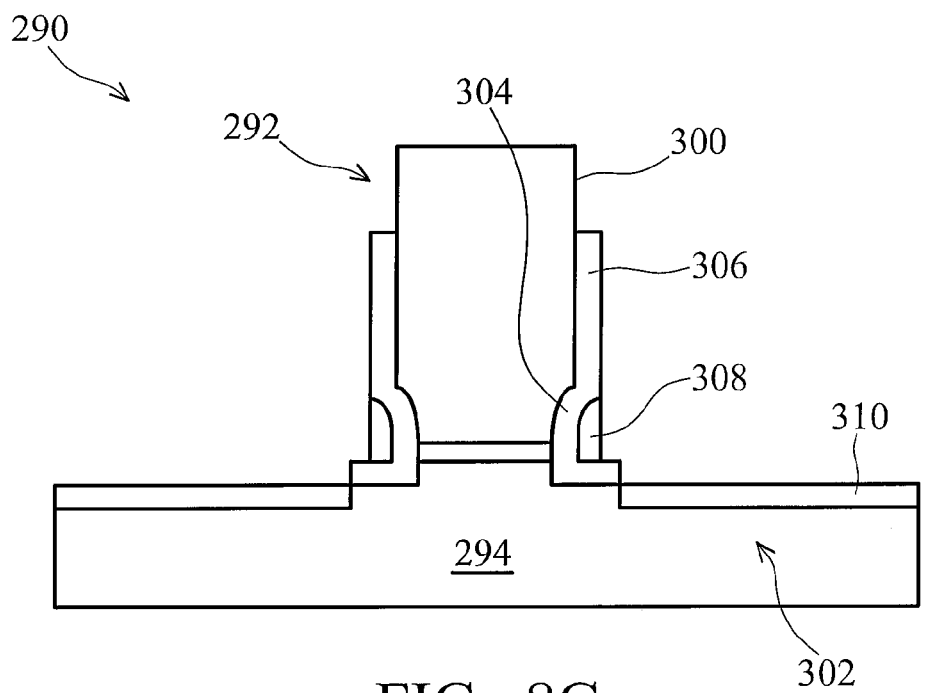

FIG. 8B shows a tunneling oxide material 306 deposited over the substrate 294, including being conformably formed on the gate stack 292. In addition, a nitride material 308 (see FIG. 8B) has been deposited on the tunneling oxide 306. FIG. 8C shows the SONOS transistor 290 after portions of the tunneling oxide material 306 and of the nitride material 308 have been removed. The tunneling oxide material 306 is extended adjacent to the gate stack 292 and is also extended adjacent to the substrate 294. The tunneling oxide material 306 and the nitride material 308 are conformably formed in the gate stack recess 304 and in the substrate recess 302. The nitride material 308 is formed in an inner corner of the tunneling oxide material 306. Although the nitride material 308 has a generally quarter-round shaped cross-section, the nitride material may have any shape. A lightly doped drain (LDD) region 310 has been formed in the substrate 294. The LDD region 310 is aligned with the tunneling oxide material 306.

Figure 8D:
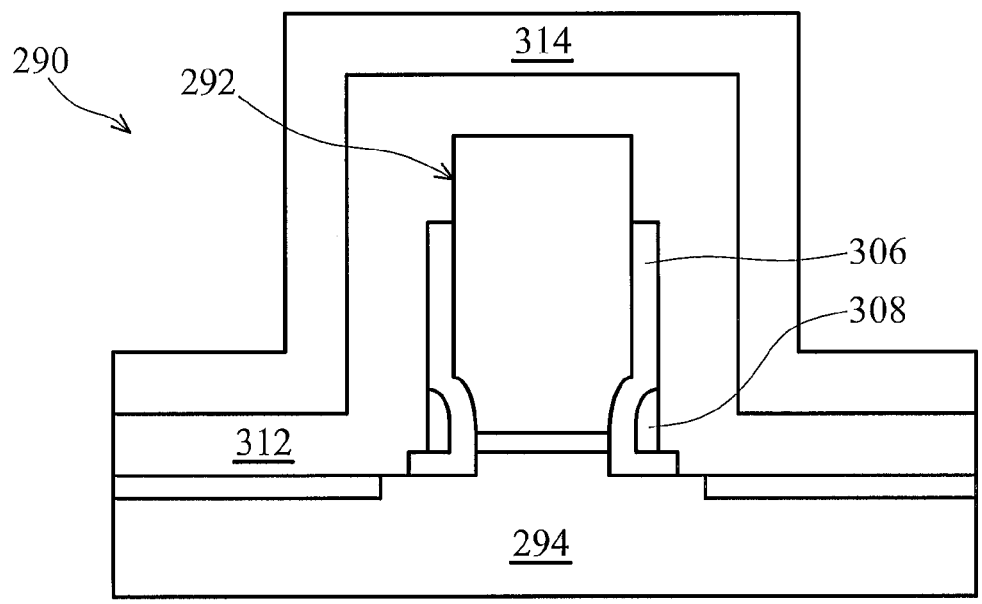
Figure 8E:
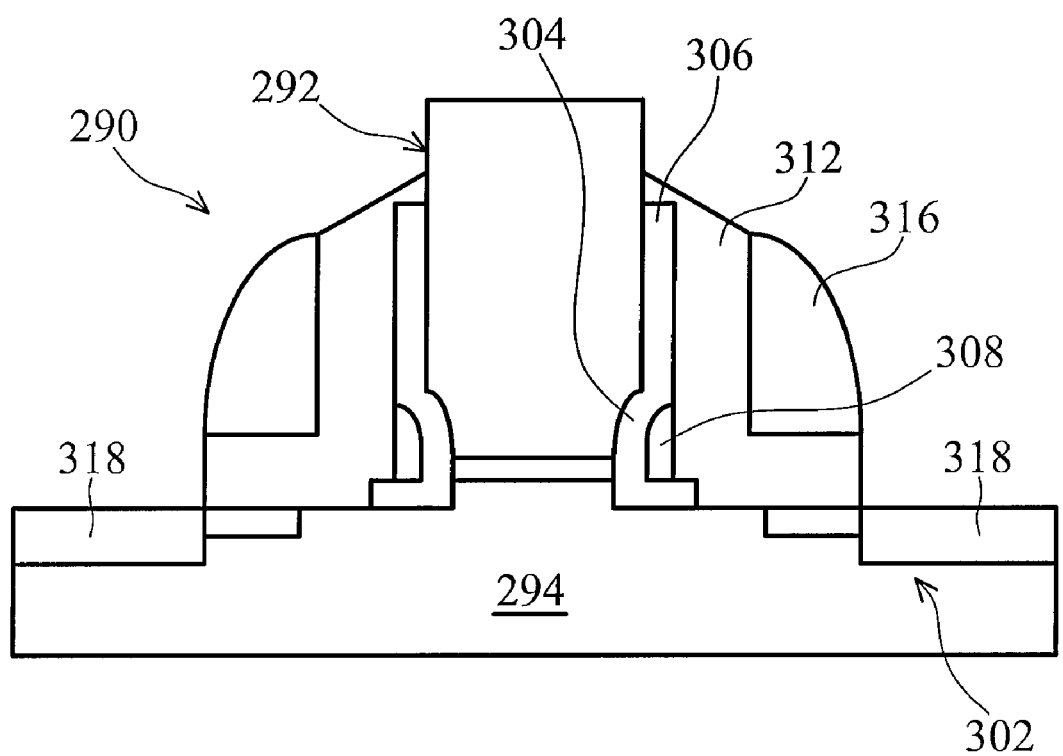

Referring to FIG. 8D, the top oxide material 312 is deposited over the substrate 294. A silicon nitride spacer material 314 is deposited over the top oxide material 312. FIG. 8E shows portions of the top oxide material 312 and the silicon nitride spacer material 314 (see FIG. 8D) are removed to form a silicon nitride spacer 316 separated from the tunneling oxide 306 and the nitride material 308 by the top oxide material 312. Source/drain regions 318 are formed in the substrate 294. The nitride material 308 is enclosed in the tunneling oxide material 306 and the top oxide material 312.

Yet another embodiment of the present invention, illustrated in FIGS. 9A-9E, provides a method of manufacturing a sidewall SONOS memory device. The cross-sectional views in FIGS. 9A-9E show the sidewall SONOS transistor 320 at various stages of a semiconductor manufacturing process.

Figure 9A:
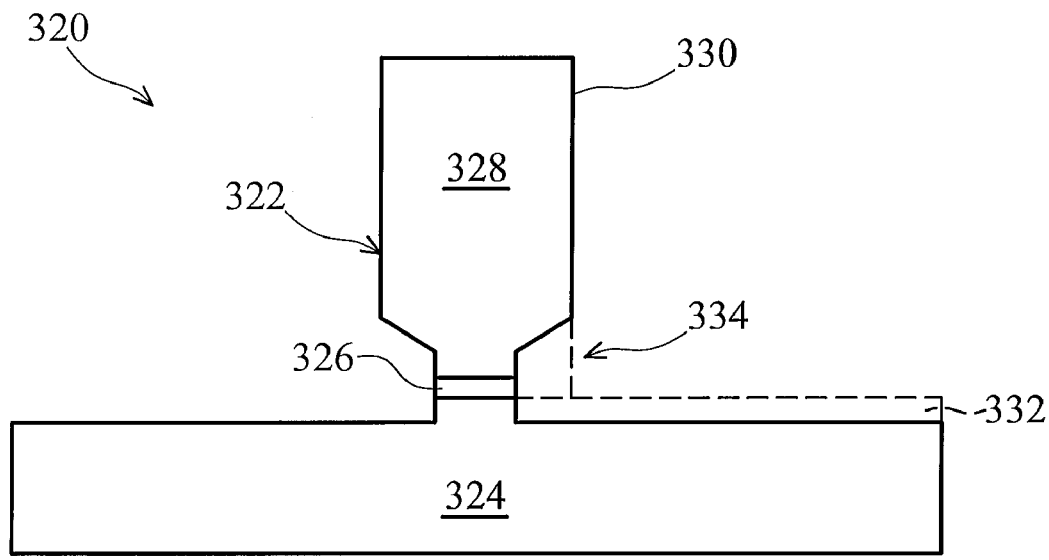
FIGS. 9A-9E show cross-sectional views of the non-volatile semiconductor memory device of yet another illustrative embodiment at various stages of manufacturing.

The gate stack 322 shown in FIG. 9A is formed on a substrate 324. The gate stack 322 has a gate dielectric 326, a gate electrode 328, and a sidewall 330. A substrate recess 332 is formed adjacent to the gate stack 322. A gate stack recess 334 is formed in a lower portion of the sidewall 330. Dotted lines outline the gate stack recess 334 and the substrate recess 332. The dotted lines are merely for illustrative purposes and may not be readily apparent in the final product.

Figure 9B:
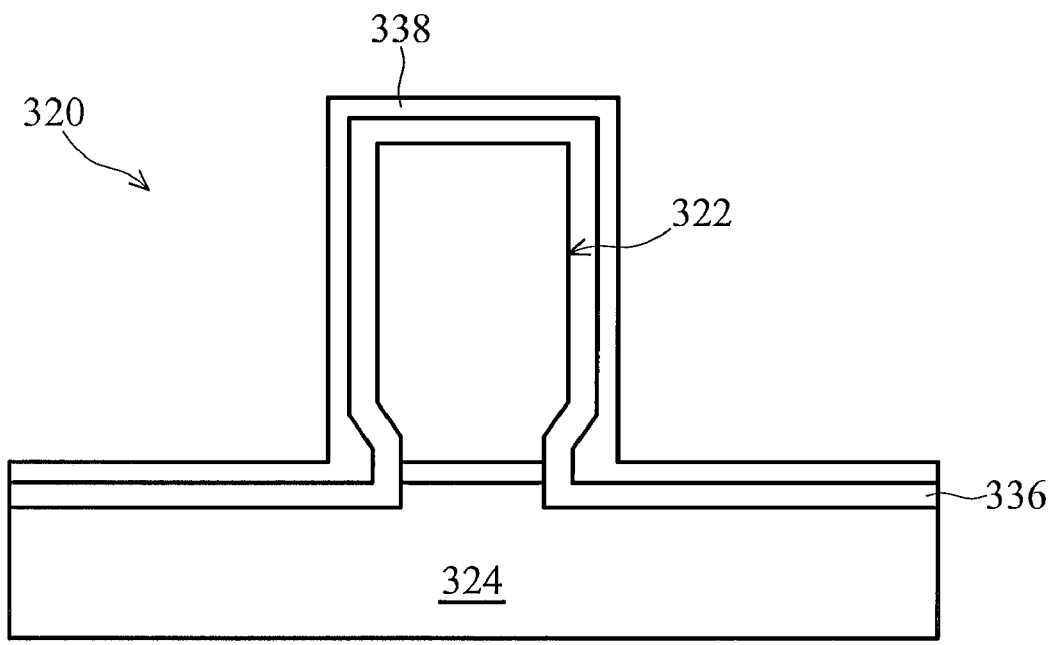
Figure 9C:
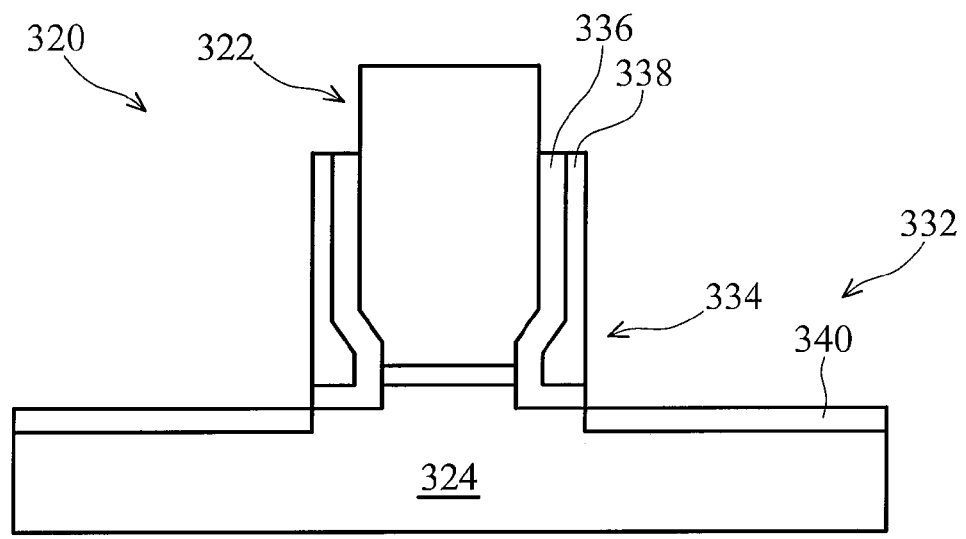

FIG. 9B shows a tunneling oxide material 336 deposited on the gate stack 322. A nitride material 338 is deposited on the tunneling oxide material 336. In FIG. 9C, portions of the tunneling oxide material 336 and of the nitride material 338 have been removed. The tunneling oxide 336 is extended adjacent to the gate stack 322 and is extended adjacent to the substrate 324. The tunneling oxide material 336 and the nitride material 338 are conformably formed in the recessed portion of the sidewall 330 and in the substrate recess 332. A portion of the nitride material 338 is formed in an inner corner of the tunneling oxide material 336 and has a generally quarter-round shaped cross-section. The nitride material 338 also extends adjacent to the gate stack 322. A lightly doped drain (LDD) region 340 has been formed in the substrate 324. The LDD region 340 is aligned with the tunneling oxide material 336.

Figure 9D:
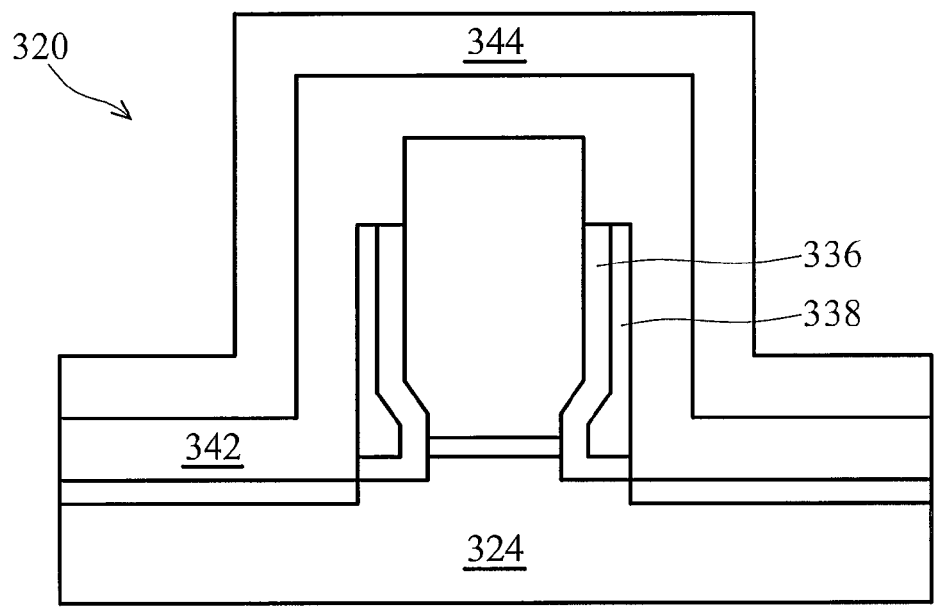
Figure 9E:
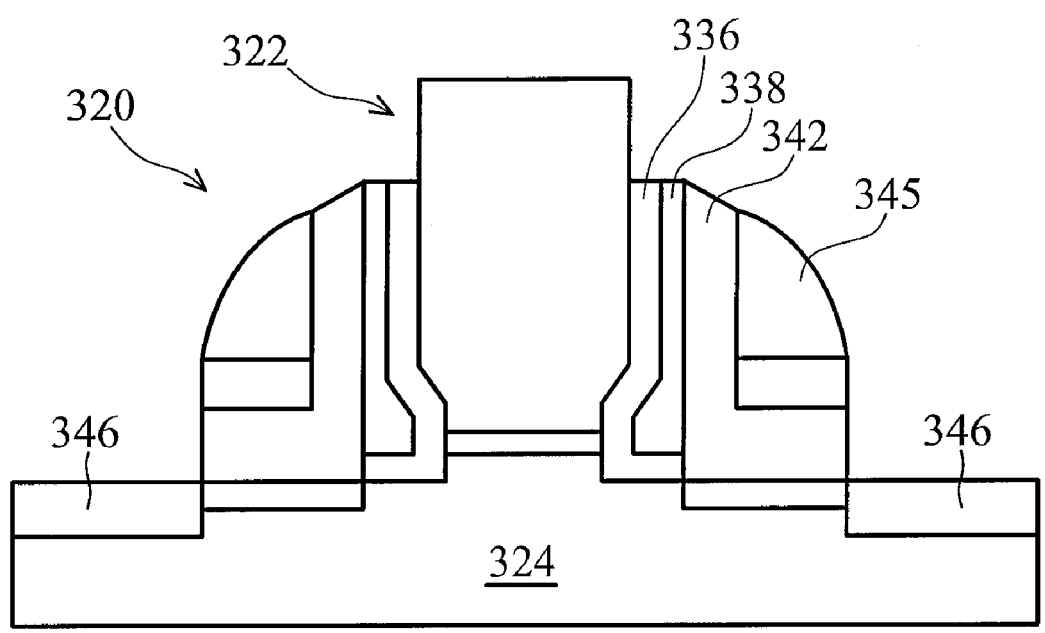

With reference now to FIG. 9D, the top oxide material 342 is deposited over the substrate 324. A silicon nitride spacer material 344 is deposited over the top oxide material 342. In FIG. 9E, portions of the top oxide material 342 and portions of the silicon nitride spacer material 344 (see FIG. 9D) have been removed to form a silicon nitride spacer 345. The spacer 344 is separated from the tunneling oxide 336 and the nitride material 338 by the top oxide material 342. Source/drain regions 346 are formed in the substrate 324.

The substrate (e.g., the substrates 143, 184, 224, 264, 294, 324 shown in FIGS. 4A, 5A, 6A, 7A, 8A, and 9A respectively) in an embodiment of the present invention may be any suitable material, including (but not necessarily limited to): any planar silicon bulk substrate, a silicon bulk substrate suitable for a fin-type field effect transistor (FinFET), a silicon on insulator (SOI) substrate, or a silicon germanium (SiGe) substrate, for example.

The gate dielectric (e.g., the gate dielectrics 145, 186, 228, 266, 296, 326 shown in FIGS. 4A, 5A, 6A, 7A, 8A, and 9A, respectively) in an embodiment of the present invention may be any suitable material, including (but not necessarily limited to): high-K dielectric materials deposited by a chemical vapor deposition process such as hafnium oxide ($HfO_2$), hafnium oxynitride (HfON), or aluminum oxide ($Al_2O_3$), combinations thereof, or composite laminates thereof, for example. The gate electrode (e.g., the gate electrodes 144, 188, 226, 268, 298, 328 shown in FIGS. 4A, 5A, 6A, 7A, 8A, and 9A, respectively) in an embodiment of the present invention may be any suitable material, including (but not necessarily limited to): a metal material, a polysilicon material, combinations thereof, or composite laminates thereof, for example.

The bottom oxide, also referred to herein as the tunneling oxide (e.g., the layers 147, 195, 236, 274, 306, 336 shown in FIGS. 4B, 5B, 6B, 7B, 8B, and 9B, respectively), in an embodiment of the present invention may have multiple layers of dielectric materials, however, none of the dielectric materials in the bottom oxide is the same material as the material in an overlying nitride storage layer (e.g., the layers 148, 196, 238, 275, 308, 338 shown in FIGS. 4B, 5B, 6B, 7B, 8B, and 9B, respectively).

The nitride storage layer (e.g., the layers 148, 196, 238, 275, 308, 338 shown in FIGS. 4B, 5B, 6B, 7B, 8B, and 9B, respectively) in an embodiment of the present invention may be any suitable material, including (but not necessarily limited to): silicon nitride (SiN), silicon oxynitride (SiON), and high-K dielectric materials deposited by a chemical vapor deposition process such as hafnium oxide ($HfO_2$), hafnium oxynitride (HfON), or aluminum oxide ($Al_2O_3$), combinations thereof, or composite laminates thereof, for example. In other embodiments of the present invention, the nitride storage layer may also be referred to as a charge-storing layer, a storage material, or a storage layer, for example. The thickness of the storage layer in embodiments of the present invention is preferably between about 30 angstroms and about 200 angstroms, for example, but may also be any suitable thickness.

The sacrificial oxide layer (e.g., the layers 149, 198, 240 shown in FIGS. 4B, 5B, and 6B, respectively) in an embodiment of the present invention may have multiple layers of dielectric materials, however, none of the dielectric materials in the sacrificial oxide of the present invention is the same material as the material in an underlying nitride storage layer (e.g., the layers 148, 196, 238, 275, 308, 338 shown in FIGS. 4B, 5B, 6B, 7B, 8B, and 9B, respectively).

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:
   forming a gate stack on a substrate, the gate stack having a sidewall;
   depositing an oxide-nitride-oxide material on the gate stack;
   removing portions of the oxide-nitride-oxide material to form an oxide-nitride-oxide structure having a generally L-shaped cross-section with a vertical portion along at least part of the gate stack sidewall and a horizontal portion along the substrate;
   depositing a top oxide material over the substrate;
   depositing a silicon nitride spacer material over the top oxide material;
   removing portions of the top oxide material and the silicon nitride spacer material to form a silicon nitride spacer separated from the oxide-nitride-oxide stack by the top oxide material;
   forming source/drain regions in the substrate; and
   wherein a portion of a top of the oxide-nitride-oxide structure is recessed relative to a top of the gate stack.

2. The method of claim 1, wherein a top of the oxide-nitride-oxide structure is recessed relative to a top of the nitride spacer.

3. The method of claim 1, further comprising forming lightly doped drain regions in the substrate adjacent the oxide-nitride-oxide structure.

4. The method of claim 1, wherein the gate stack comprises a gate electrode and a gate dielectric, and the gate dielectric comprises a high-K dielectric material deposited by a chemical vapor deposition process.

5. The method of claim 1, wherein a nitride material in the oxide-nitride-oxide structure is a high-K dielectric material deposited by a chemical vapor deposition process.

6. The method of claim 1, wherein a top oxide in the oxide-nitride-oxide structure comprises a multi-layer material deposited by a chemical vapor deposition process.

7. The method of claim 1, wherein a thickness of a nitride material in the oxide-nitride-oxide structure is controlled by a chemical vapor deposition process.

8. The method of claim 1, wherein a thickness of a nitride material in the oxide-nitride-oxide structure extending along the substrate is controlled by a dry etch process.

9. A method of manufacturing a semiconductor device, comprising:
   forming a gate stack on a substrate, the gate stack having a sidewall;
   forming a recess in a lower portion of the sidewall;
   depositing an oxide-nitride-oxide material on the gate stack;
   removing portions of the oxide-nitride-oxide material to form an oxide-nitride-oxide structure having a generally L-shaped cross-section, wherein the oxide-nitride-oxide structure is conformably formed in the recessed portion of the sidewall, a vertical portion of the oxide-nitride-oxide structure is formed along at least part of the gate stack sidewall and a horizontal portion along the substrate;
   depositing a top oxide material over the substrate;
   depositing a silicon nitride spacer material over the top oxide material;
   removing portions of the top oxide material and the silicon nitride spacer material to form a silicon nitride spacer separated from the oxide-nitride-oxide stack by the top oxide material; and
   forming source/drain regions in the substrate.

10. The method of claim 9, further comprising forming lightly doped drain regions in the substrate adjacent the oxide-nitride-oxide structure.

11. The method of claim 9, wherein the gate stack comprises a high-K dielectric material deposited by a chemical vapor deposition process.

12. The method of claim 9, wherein a nitride material in the oxide-nitride-oxide structure is deposited by a chemical vapor deposition process.

13. The method of claim 9, wherein a top oxide in the oxide-nitride-oxide structure comprises a multi-layer material deposited by a chemical vapor deposition process.

14. The method of claim 9, wherein a thickness of a nitride material in the oxide-nitride-oxide structure extending along the gate stack and is controlled by a chemical vapor deposition process.

15. The method of claim 9, wherein a nitride material in the oxide-nitride-oxide structure extending along the substrate is controlled by a dry etch process.

16. A method of manufacturing a semiconductor device, comprising:

forming a gate stack on a substrate, the gate stack having a sidewall;

forming a substrate recess adjacent the gate stack;

depositing an oxide-nitride-oxide material over the substrate;

removing portions of the oxide-nitride-oxide material to form an oxide-nitride-oxide structure having a generally L-shaped cross-section with a vertical portion along at least part of the gate stack sidewall and a horizontal portion along the substrate;

depositing a top oxide material over the substrate;

depositing a silicon nitride spacer material over the top oxide material;

removing portions of the top oxide material and the silicon nitride spacer material to form a silicon nitride spacer separated from the oxide-nitride-oxide stack by the top oxide material; and forming source/drain regions in the substrate.

17. The method of claim 16, further comprising forming lightly doped drain regions in the substrate adjacent the oxide-nitride-oxide structure.

18. The method of claim 16, wherein a gate dielectric comprises a high-K dielectric material deposited by a chemical vapor deposition process, wherein a nitride material in the oxide-nitride-oxide structure is a high-K dielectric material deposited by a chemical vapor deposition process, and wherein the top oxide material in the oxide-nitride-oxide structure comprises a multi-layer material deposited by a chemical vapor deposition process.

19. The method of claim 16, wherein a thickness of a nitride material in the oxide-nitride-oxide structure extending along the gate stack is controlled by a chemical vapor deposition process.

20. The method of claim 16, wherein a nitride material in the oxide-nitride-oxide structure extending along the substrate is controlled by a dry etch process.

* * * * *